(12) United States Patent
Breed et al.

(10) Patent No.: US 7,602,313 B2
(45) Date of Patent: Oct. 13, 2009

(54) LICENSE PLATE INCLUDING TRANSPONDER

(75) Inventors: David S. Breed, Miami Beach, FL (US); Wendell C. Johnson, Kaneohe, HI (US)

(73) Assignee: Intelligent Technologies International, Inc., Denville, NJ (US)

( * ) Notice: Subject to any disclaimer, the term of this patent is extended or adjusted under 35 U.S.C. 154(b) by 0 days.

(21) Appl. No.: 12/062,177

(22) Filed: Apr. 3, 2008

(65) Prior Publication Data

US 2008/0180280 A1 Jul. 31, 2008

Related U.S. Application Data

(63) Continuation-in-part of application No. 10/940,881, filed on Sep. 13, 2004, which is a continuation-in-part of application No. 10/613,453, filed on Jul. 3, 2003, now Pat. No. 6,850,824, which is a continuation of (Continued)

(60) Provisional application No. 60/711,452, filed on Aug. 25, 2005, provisional application No. 60/062,729, filed on Oct. 22, 1997, provisional application No. 60/123,882, filed on Mar. 11, 1999, provisional application No. 60/231,378, filed on Sep. 8, 2000, provisional application No. 60/269,415, filed on Feb. 16, 2001, provisional application No. 60/291,511, filed on May 16, 2001, provisional application No. 60/304,013, filed on Jul. 9, 2001.

(51) Int. Cl.
G08G 1/01 (2006.01)

(52) U.S. Cl. .................. 340/933; 340/10.4; 340/572.7; 340/572.8; 340/693.1; 343/878

(58) Field of Classification Search ................ 340/933, 340/572.1, 572.7, 572.8, 10.1, 10.4, 10.42, 340/693.1, 902; 310/313 R; 701/29, 32; 343/878; 235/384
See application file for complete search history.

(56) References Cited

U.S. PATENT DOCUMENTS

| | | | | |
|---|---|---|---|---|
| 4,059,831 A * | 11/1977 | Epstein | ......................... | 342/44 |
| 4,912,471 A * | 3/1990 | Tyburski et al. | .......... | 340/10.34 |
| 5,159,332 A * | 10/1992 | Walton | ...................... | 340/10.3 |
| 5,457,447 A * | 10/1995 | Ghaem et al. | ............. | 340/10.42 |
| 5,504,485 A * | 4/1996 | Landt et al. | .................... | 342/42 |
| 5,608,391 A * | 3/1997 | Bantli et al. | ................. | 340/933 |
| 5,635,693 A * | 6/1997 | Benson et al. | ........... | 340/10.33 |
| 5,644,119 A * | 7/1997 | Padula et al. | ................. | 235/384 |
| 6,107,910 A * | 8/2000 | Nysen | ........................ | 340/10.1 |
| 6,370,475 B1 | 4/2002 | Breed et al. | | |
| 6,405,132 B1 | 6/2002 | Breed et al. | | |
| 6,427,913 B1 * | 8/2002 | Maloney | ...................... | 235/383 |
| 6,758,089 B2 | 7/2004 | Breed et al. | | |

* cited by examiner

*Primary Examiner*—Thomas J Mullen
(74) *Attorney, Agent, or Firm*—Brian Roffe

(57) ABSTRACT

License plate for a vehicle includes a plate having an indicia and arranged to be mounted on the vehicle, and a transponder arranged in the plate. The transponder is arranged to receive a signal from an interrogator, modify the received signal and transmitted the modified signal to the interrogator. The transponder may be a SAW transponder, an RFID transponder and/or include a reflective or back scattering antenna, a polarization antenna, a rotating antenna, or a corner cube or dihedral reflector. An energy harvesting component can be arranged on the license plate or in the license plate for providing power to the transponder. The energy harvesting component generates energy during or from movement or vibration of the vehicle.

20 Claims, 26 Drawing Sheets

Related U.S. Application Data application No. 10/188,673, filed on Jul. 3, 2002, now Pat. No. 6,738,697, which is a continuation-in-part of application No. 10/079,065, filed on Feb. 19, 2002, now Pat. No. 6,662,642, which is a continuation-in-part of application No. 09/765,558, filed on Jan. 19, 2001, now Pat. No. 6,748,797, and a continuation-in-part of application No. 11/082,739, filed on Mar. 17, 2005, now Pat. No. 7,421,321, which is a continuation-in-part of application No. 10/701,361, filed on Nov. 4, 2003, now Pat. No. 6,988,026, which is a continuation-in-part of application No. 09/765,558, and a continuation-in-part of application No. 10/079,065, and a continuation-in-part of application No. 10/188,673, and a continuation-in-part of application No. 10/613,453, and a continuation-in-part of application No. 11/461,619, filed on Aug. 1, 2006, now Pat. No. 7,418,346, and a continuation-in-part of application No. 10/822,445, filed on Apr. 12, 2004, now Pat. No. 7,085,637, which is a continuation-in-part of application No. 10/118,858, filed on Apr. 19, 2002, now Pat. No. 6,720,920, which is a continuation-in-part of application No. 09/177,041, filed on Oct. 22, 1998, now Pat. No. 6,370,475, and a continuation-in-part of application No. 09/679,317, filed on Oct. 4, 2000, now Pat. No. 6,405,132, which is a continuation-in-part of application No. 09/523,559, filed on Mar. 10, 2000, now abandoned, and a continuation-in-part of application No. 09/909,466, filed on Jul. 19, 2001, now Pat. No. 6,526,352, and a continuation-in-part of application No. 10/216,633, filed on Aug. 9, 2002, now Pat. No. 6,768,944, and a continuation-in-part of application No. 11/028,386, filed on Jan. 3, 2005, now Pat. No. 7,110,880, which is a continuation-in-part of application No. 10/822,445, and a continuation-in-part of application No. 11/034,325, filed on Jan. 12, 2005, now Pat. No. 7,202,776, which is a continuation-in-part of application No. 10/822,445, and a continuation-in-part of application No. 11/464,385, filed on Aug. 14, 2006, and a continuation-in-part of application No. 11/028,386, and a continuation-in-part of application No. 11/034,325, and a continuation-in-part of application No. 11/681,817, filed on Mar. 5, 2007, now Pat. No. 7,426,437, which is a continuation-in-part of application No. 11/034,325, and a continuation-in-part of application No. 11/778,127, filed on Jul. 16, 2007, which is a continuation-in-part of application No. 11/562,730, filed on Nov. 22, 2006, now Pat. No. 7,295,925, which is a continuation-in-part of application No. 11/034,325, and a continuation-in-part of application No. 11/874,418, filed on Oct. 18, 2007, which is a continuation-in-part of application No. 11/562,730.

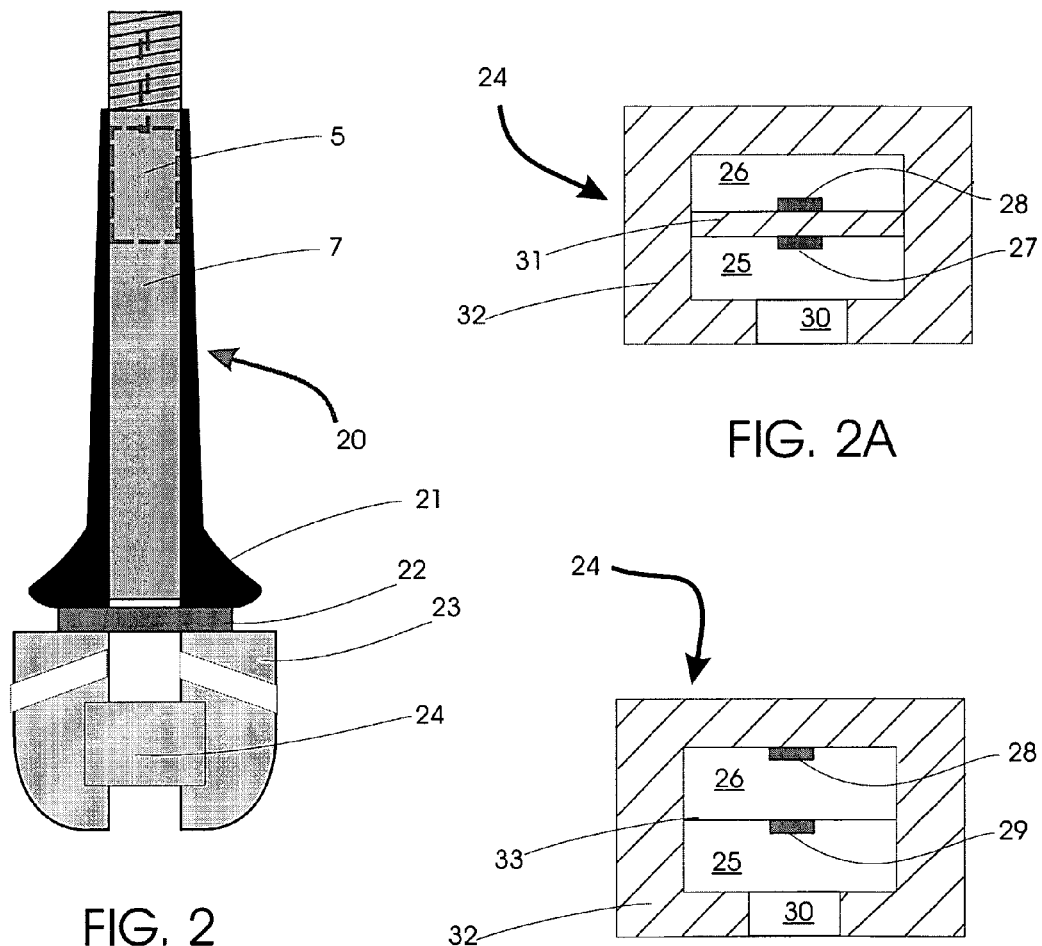

PRIOR ART

Prior Art

FIG. 11A
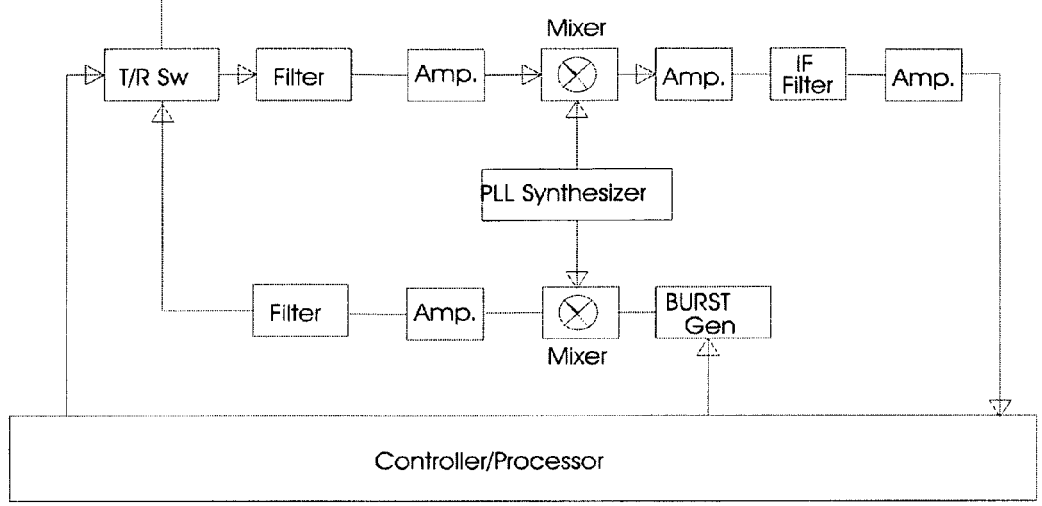
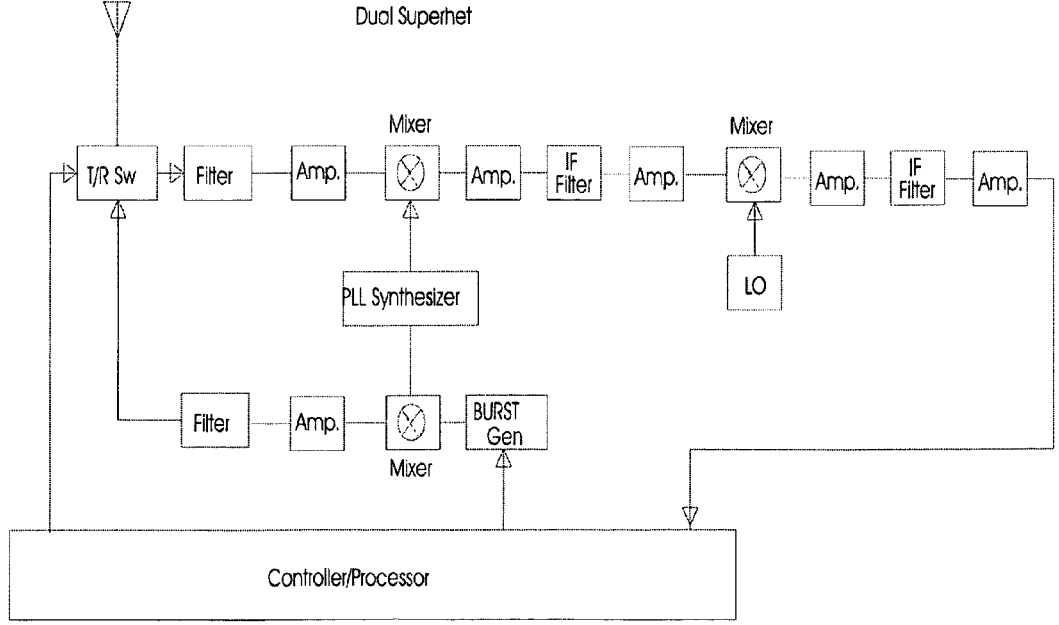
FIG. 11B

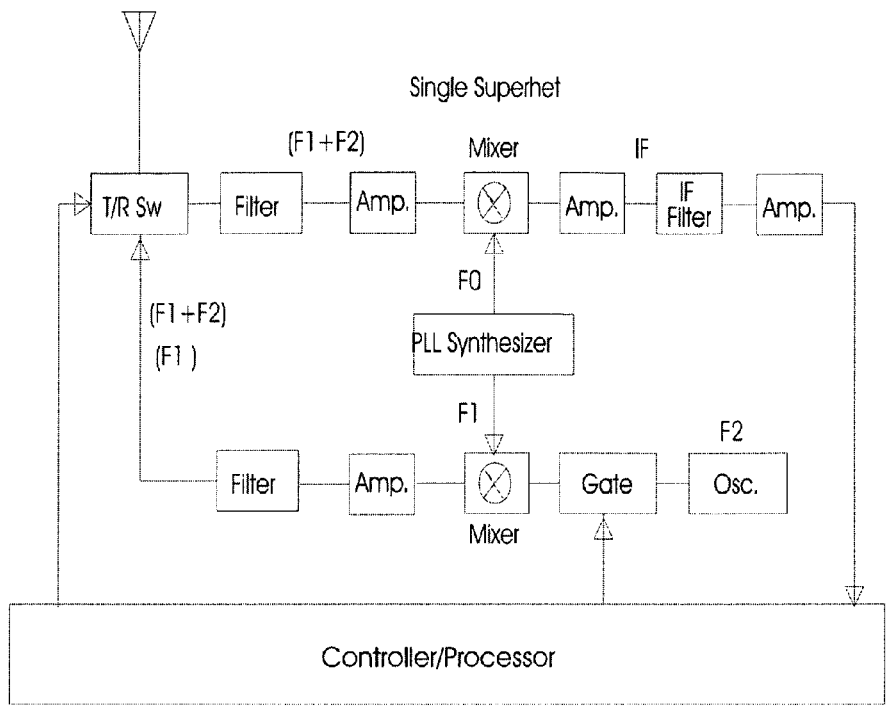
FIG. 11C
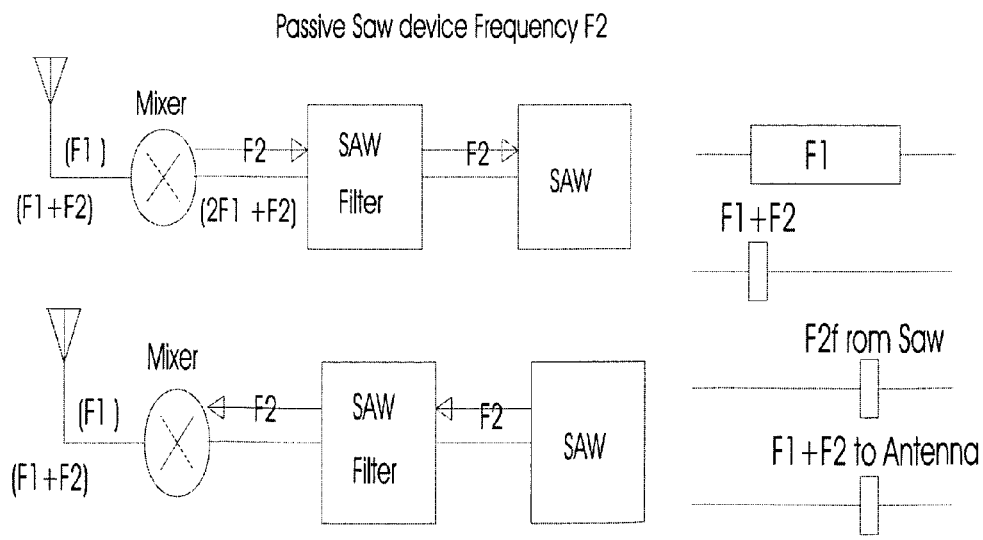

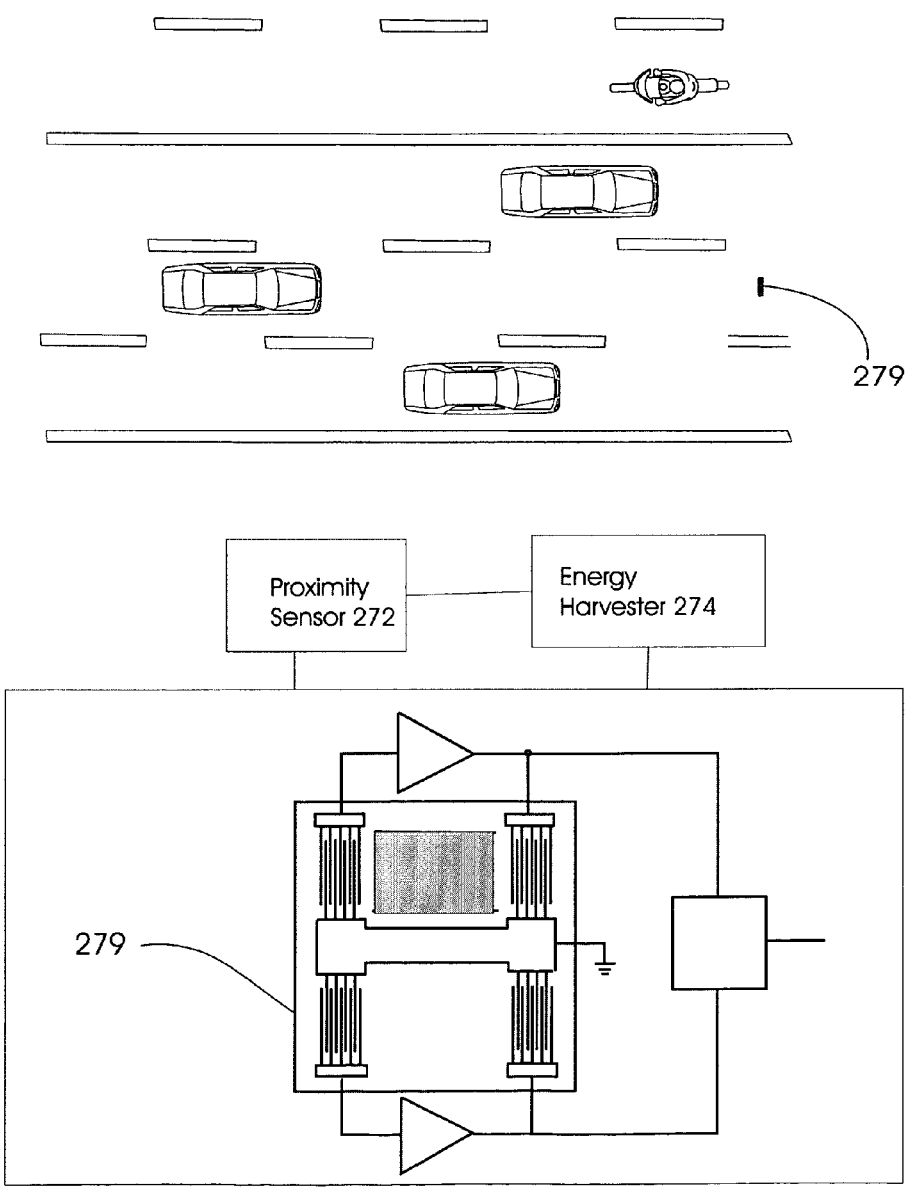

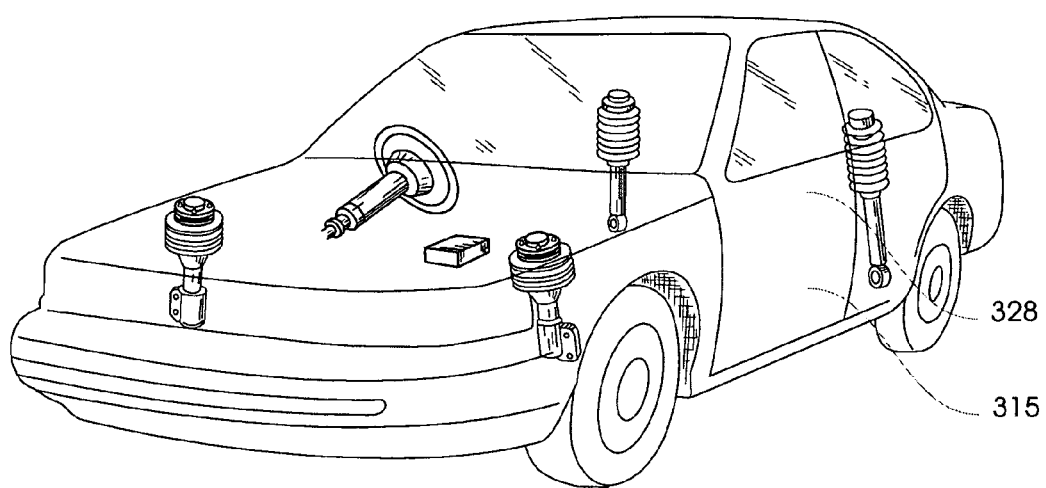
FIG. 17
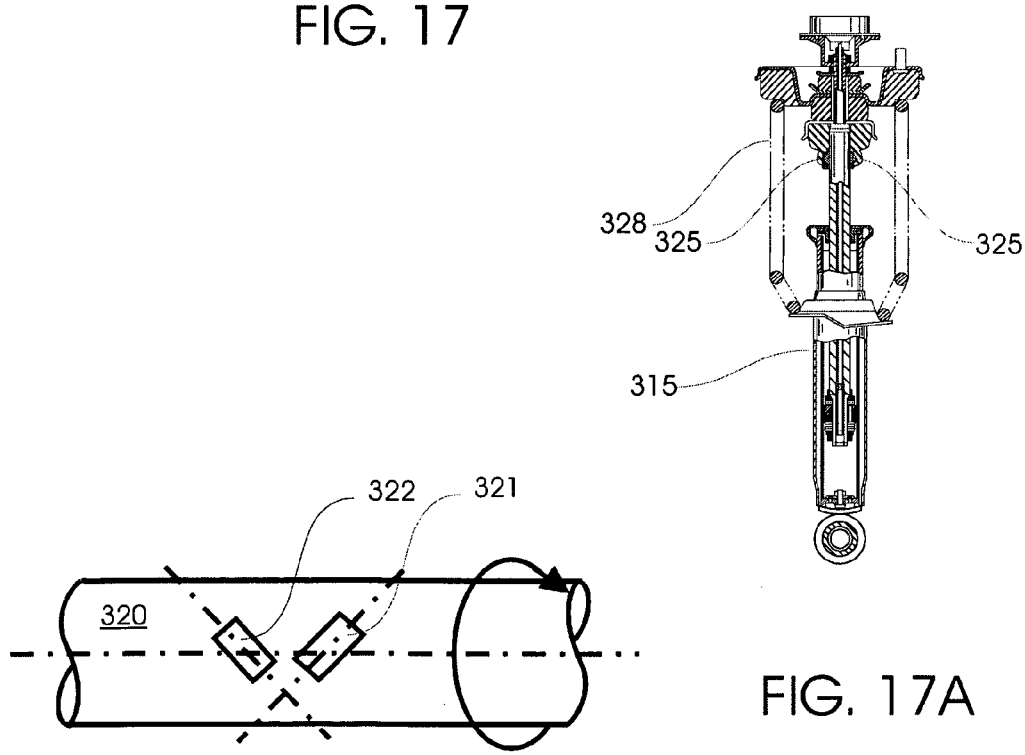
FIG. 17A
FIG. 17B

Prior Art

LICENSE PLATE INCLUDING TRANSPONDER

CROSS REFERENCE TO RELATED APPLICATIONS

This application is:
1. a continuation-in-part (CIP) of U.S. patent application Ser. No. 10/940,881 filed Sep. 13, 2004 which is a CIP of U.S. patent application Ser. No. 10/613,453 filed Jul. 3, 2003, now U.S. Pat. No. 6,850,824, which is a continuation of U.S. patent application Ser. No. 10/188,673 filed Jul. 3, 2002, now U.S. Pat. No. 6,738,697, which is a CIP of U.S. patent application Ser. No. 10/079,065 filed Feb. 19, 2002, now U.S. Pat. No. 6,662,642, which is:
   A. a CIP of U.S. patent application Ser. No. 09/765,558 filed Jan. 19, 2001, now U.S. Pat. No. 6,748,797, which claims priority under 35 U.S.C. §119(e) of U.S. provisional patent application Ser. No. 60/231,378 filed Sep. 8, 2000, now expired; and
   B. claims priority under 35 U.S.C. §119(e) of U.S. provisional patent application Ser. No. 60/269,415 filed Feb. 16, 2001, now expired, U.S. provisional patent application Ser. No. 60/291,511 filed May 16, 2001, now expired, and U.S. provisional patent application Ser. No. 60/304,013 filed Jul. 9, 2001, now expired; and
2. a CIP of U.S. patent application Ser. No. 11/082,739 filed Mar. 17, 2005, now U.S. Pat No. 7,421,321, which is a CIP of U.S. patent application Ser. No. 10/701,361, filed Nov. 4, 2003, now U.S. Pat. No. 6,988,026, which is:
   A. a CIP of U.S. patent application Ser. No. 09/765,558 filed Jan. 19, 2001, now U.S. Pat. No. 6,748,797, the history of which is set forth above;
   B. a CIP of U.S. patent application Ser. No. 10/079,065 filed Feb. 19, 2002, now U.S. Pat. No. 6,662,642, the history of which is set forth above;
   C. a CIP of U.S. patent application Ser. No. 10/188,673, filed Jul. 3, 2002, now U.S. Pat. No. 6,738,697, the history of which is set forth above;
   D. a CIP of U.S. patent application Ser. No. 10/613,453 filed Jul. 3, 2003, now U.S. Pat. No. 6,850,824; and
3. a CIP of U.S. patent application Ser. No. 11/461,619 filed Aug. 1, 2006, now U.S. Pat. No. 7,418,346, which claims priority under 35 U.S.C. §119(e) of U.S. provisional patent application Ser. No. 60/711,452 filed Aug. 25, 2005, now expired, and is:
   A. a CIP of U.S. patent application Ser. No. 10/822,445 filed Apr. 12, 2004, now U.S. Pat. No. 7,085,637, which is:
      1) a CIP of U.S. patent application Ser. No. 10/118,858 filed Apr. 9, 2002, now U.S. Pat. No. 6,720,920, which is:
         a) a CIP of U.S. patent application Ser. No. 09/177,041 filed Oct. 22, 1998, now U.S. Pat. No. 6,370,475, which claims priority under 35 U.S.C. §119(e) of U.S. provisional patent application Ser. No. 60/062,729 filed Oct. 22, 1997, now expired;
         b) a CIP of U.S. patent application Ser. No. 09/679,317 filed Oct. 4, 2000, now U.S. Pat No. 6,405,132, which is a CIP of U.S. patent application Ser. No. 09/523,559 filed Mar. 10, 2000, now abandoned, which claims priority under 35 U.S.C. §119(e) of U.S. provisional patent application Ser. No. 60/123,882 filed Mar. 11, 1999, now expired; and
         c) a CIP of U.S. patent application Ser. No. 09/909,466 filed Jul. 19, 2001, now U.S. Pat. No. 6,526,352; and
      2) a CIP of U.S. patent application Ser. No. 10/216,633 filed Aug. 9, 2002, now U.S. Pat. No. 6,768,944; and
   B. a CIP of U.S. patent application Ser. No. 11/028,386 filed Jan. 3, 2005, now U.S. Pat. No. 7,110,880 which is a CIP of U.S. patent application Ser. No. 10/822,445 filed Apr. 12, 2004, now U.S. Pat. No. 7,085,637, the history of which is set forth above; and
   C. a CIP of U.S. patent application Ser. No. 11/034,325 filed Jan. 12, 2005, now U.S. Pat. No. 7,202,776 which is a CIP of U.S. patent application Ser. No. 10/822,445 filed Apr. 12, 2004, now U.S. Pat. No. 7,085,637, the history of which is set forth above;
4. a CIP of U.S. patent application Ser. No. 11/464,385 filed Aug. 14, 2006 which claims priority under 35 U.S.C. §119 (e) of U.S. provisional patent application Ser. No. 60/711,452 filed Aug. 25, 2005, now expired, and is a CIP of U.S. patent application Ser. No. 11/028,386 filed Jan. 3, 2005, now U.S. Pat. No. 7,110,880, and a CIP of U.S. patent application Ser. No. 11/034,325 filed Jan. 12, 2005, now U.S. Pat. No. 7,202,776;
5. a CIP of U.S. patent application Ser. No. 11/681,817 filed Mar. 5 2007, now U.S. Pat. No. 7,426,437, which is a CIP of U.S. patent application Ser. No. 11/034,325 filed Jan. 12, 2005, now U.S. Pat. No. 7,202,776, the history of which is set forth above;
6. a CIP of U.S. patent application Ser. No. 11/778,127 filed Jul. 16, 2007 which is a CIP of U.S. patent application Ser. No. 11/562,730 filed Nov. 22, 2006, now U.S. Pat. No. 7,295,925, which is a CIP of U.S. patent application Ser. No. 11/034,325 filed Jan. 12, 2005, now U.S. Pat. No. 7,202,776, the history of which is set forth above; and
7. a CIP of U.S. patent application Ser. No. 11/874,418 filed Oct. 18, 2007 which is a CIP of U.S. patent application Ser. No. 11/562,730 filed Nov. 22, 2006, now U.S. Pat. No. 7,295,925, the history of which is set forth above.

This application is related to, on the grounds that it includes common subject matter as, U.S. patent application Ser. No. 10/190,805, now U.S. Pat. No. 6,758,089.

All of the references, patents and patent applications that are referred to herein and in the parent applications are incorporated by reference in their entirety as if they had each been set forth herein in full.

FIELD OF THE INVENTION

The invention relates to the field of license plates including transponders which can provide information about the vehicle to, for example, other vehicles or infrastructure.

BACKGROUND OF THE INVENTION

This invention is related to the use of license plates on vehicles which are provided with transponders to transmit information about the vehicle. Transponders for tolling purposes are now well-known but are not arranged in the license plate. Rather, some tolling transponders are arranged in a housing which is attached to the vehicle using the same screws which attach the license plate to the transponder and thus are not in the license plate.

Additional and detailed background of the invention is set forth in the patents issued from the parent applications, namely U.S. Pat. No. 6,662,642, as well as U.S. Pat. No. 6,758,089.

OBJECTS OF THE INVENTION

It is an object of the invention to provide new and improved license plates including transponders which can provide information about the vehicle to, for example, other vehicles or infrastructure.

In order to achieve this object and possibly others, a license plate for a vehicle in accordance with the invention includes a plate having indicia and arranged to be mounted on the vehicle, and a transponder arranged in the plate. The transponder is arranged to receive a signal from an interrogator, modify the received signal and transmit the modified signal to the interrogator. The transponder may be a SAW transponder, an RFID transponder and/or include a reflective or back scattering antenna, a polarization antenna, a rotating antenna, or a corner cube or dihedral reflector.

An energy harvesting component can be arranged on the license plate or in the license plate for providing power to the transponder. The energy harvesting component generates energy during or from movement or vibration of the vehicle.

A vehicle including the license plate in any of the embodiments described above may also include at least one additional transponder, each arranged to receive a signal from the interrogator, modify the received signal and transmitted the modified signal to the interrogator.

In one embodiment, the transponder is not a separate component from the plate, i.e., not independently removable or detachable therefrom, but rather is integrated therein.

Another embodiment of a license plate for a vehicle in accordance with the invention includes a plate having an indicia and arranged to be mounted on the vehicle, and an RFID tag arranged as part of the plate, the RFID tag being arranged to respond to an activation signal and provide information related to at least one of the type, size and mass of the vehicle to which the plate is mounted. The type of vehicle may be an indication of whether the vehicle has special travel privileges. The features of the license plate described above may be incorporated in this embodiment as well, e.g., an energy harvesting component for providing power to the RFID tag.

Exemplifying embodiments of the invention are described above and unless specifically noted, it is the applicant's intention that the words and phrases in the specification and claims be given the ordinary and accustomed meaning to those of ordinary skill in the applicable art(s). If applicant intends any other meaning, he will specifically state he is applying a special meaning to a word or phrase.

Likewise, applicant's use of the word "function" herein is not intended to indicate that the applicant seeks to invoke the special provisions of 35 U.S.C. §112, sixth paragraph, to define his invention. To the contrary, if applicant wishes to invoke the provisions of 35 U.S.C. §112, sixth paragraph, to define his invention, he will specifically set forth in the claims the phrases "means for" or "step for" and a function, without also reciting in that phrase any structure, material or act in support of the function. Moreover, even if applicant invokes the provisions of 35 U.S.C. §112, sixth paragraph, to define his invention, it is the applicant's intention that his invention not be limited to the specific structure, material or acts that are described in the preferred embodiments herein. Rather, if applicant claims his inventions by specifically invoking the provisions of 35 U.S.C. §112, sixth paragraph, it is nonetheless his intention to cover and include any and all structure, materials or acts that perform the claimed function, along with any and all known or later developed equivalent structures, materials or acts for performing the claimed function.

Further, the applicant intends that everything disclosed herein can be used in combination on a single vehicle or structure.

BRIEF DESCRIPTION OF THE DRAWINGS

The following drawings are illustrative of embodiments of the invention and are not meant to limit the scope of the invention as encompassed by the claims.

FIG. 2 is a partial cutaway view of an interior SAW tire temperature and pressure monitor mounted onto and below the valve stem.

FIG. 2A is a sectioned view of the SAW tire pressure and temperature monitor of FIG. 2 incorporating an absolute pressure SAW device.

FIG. 2B is a sectioned view of the SAW tire pressure and temperature monitor of FIG. 2 incorporating a differential pressure SAW device.

FIGS. 11A, 11B and 11C are block diagrams of three interrogators that can be used with this invention to interrogate several different devices.

FIG. 14 is an overhead view of a roadway with vehicles and a SAW road temperature and humidity monitoring sensor.

FIG. 14A is a detail drawing of the monitoring sensor of FIG. 14.

FIG. 17 is a perspective view of a vehicle suspension system with SAW load sensors.

FIG. 17A is a cross section detail view of a vehicle spring and shock absorber system with a SAW torque sensor system mounted for measuring the stress in the vehicle spring of the suspension system of FIG. 17.

FIG. 17B is a detail view of a SAW torque sensor and shaft compression sensor arrangement for use with the arrangement of FIG. 17.

DETAILED DESCRIPTION OF PREFERRED EMBODIMENTS

Figure 1A:
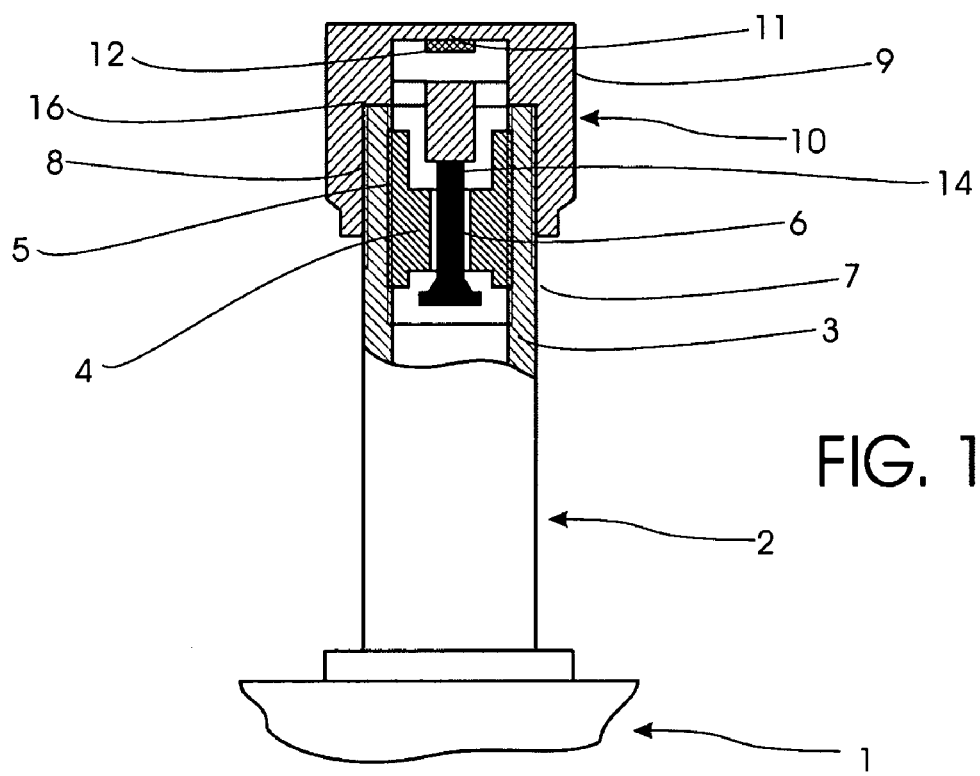
FIG. 1A is a partial cutaway view of a tire pressure monitor using an absolute pressure measuring SAW device.

Referring now to the drawings wherein the same reference numerals refer to the same or similar elements, a first embodiment of a valve cap 10 including a tire pressure monitoring system in accordance with the invention is shown generally at 10 in FIG. 1A. A tire 1 has a protruding, substantially cylindrical valve stem 2 which is shown in a partial cutaway view in FIG. 1A. The valve stem 2 comprises a sleeve 3 and a tire valve assembly 5. The sleeve 3 of the valve stem 2 is threaded on both its inner surface and its outer surface. The tire valve assembly 5 is arranged in the sleeve 3 and includes threads on an outer surface which are mated with the threads on the inner surface of the sleeve 3. The valve assembly 5 comprises a valve seat 4 and a valve pin 6 arranged in an aperture in the valve seat 4. The valve assembly 5 is shown in the open condition in FIG. 1A whereby air flows through a passage between the valve seat 4 and the valve pin 6.

The valve cap 10 includes a substantially cylindrical body 9 and is attached to the valve stem 2 by means of threads 8 arranged on an inner cylindrical surface of body 9 which are mated with the threads on the outer surface of the sleeve 3. The valve cap 10 comprises a valve pin depressor 14 arranged in connection with the body 9 and a SAW pressure sensor 11. The valve pin depressor 14 engages the valve pin 6 upon attachment of the valve cap 10 to the valve stem 2 and depresses it against its biasing spring, not shown, thereby opening the passage between the valve seat 4 and the valve pin 6 allowing air to pass from the interior of tire 1 into a reservoir or chamber 12 in the body 9. Chamber 12 contains the SAW pressure sensor 11 as described in more detail below.

Pressure sensor 11 is an absolute pressure-measuring device. It functions based on the principle that the increase in air pressure and thus air density in the chamber 12 increases the mass loading on a SAW device changing the velocity of surface acoustic wave on the piezoelectric material. The pressure sensor 11 is therefore positioned in an exposed position in the chamber 12.

Figure 1B:
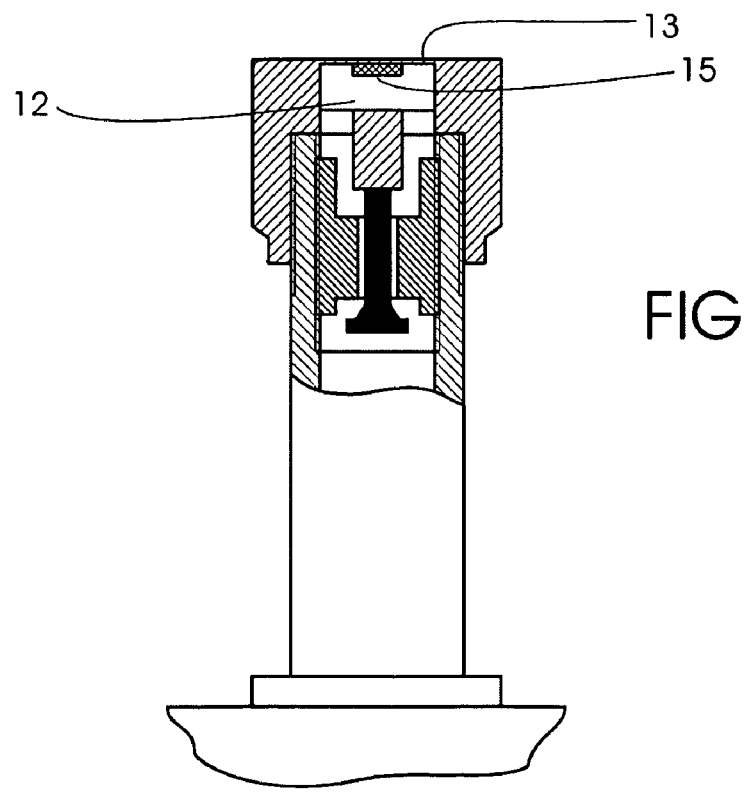
FIG. 1B is a partial cutaway view of a tire pressure monitor using a differential pressure measuring SAW device.

A second embodiment of a valve cap 10' in accordance with the invention is shown in FIG. 1B and comprises a SAW strain sensing device 15 that is mounted onto a flexible membrane 13 attached to the body 9' of the valve cap 10' and in a position in which it is exposed to the air in the chamber 12'. When the pressure changes in chamber 12', the deflection of the membrane 13 changes thereby changing the stress in the SAW device 15.

Strain sensor 15 is thus a differential pressure-measuring device. It functions based on the principle that changes in the flexure of the membrane 13 can be correlated to changes in pressure in the chamber 12' and thus, if an initial pressure and flexure are known, the change in pressure can be determined from the change in flexure.

FIGS. 1A and 1B therefore illustrate two different methods of using a SAW sensor in a valve cap for monitoring the pressure inside a tire. The precise manner in which the SAW sensors 11,15 operate is discussed fully below but briefly, each sensor 11,15 includes an antenna and an interdigital transducer which receives a wave via the antenna from an interrogator which proceeds to travel along a substrate (the membrane in the embodiment shown in FIG. 1B). The time in which the waves travel across the substrate and return to the interdigital transducer is dependent on the temperature, the mass loading on the substrate (in the embodiment of FIG. 1A) or the flexure of membrane 13 (in the embodiment of FIG. 1B). The antenna transmits a return wave which is receives and the time delay between the transmitted and returned wave is calculated and correlated to the pressure in the chamber 12 or 12'.

Sensors 11 and 15 are electrically connected to the metal valve cap 10 that is electrically connected to the valve stem 2.

The valve stem 2 is electrically isolated from the tire rim and serves as an antenna for transmitting radio frequency electromagnetic signals from the sensors 11 and 15 to a vehicle mounted interrogator, not shown, to be described in detail below. As shown in FIG. 1A., a pressure seal 16 is arranged between an upper rim of the sleeve 3 and an inner shoulder of the body 9 of the valve cap 10 and serves to prevent air from flowing out of the tire 1 to the atmosphere.

The speed of the surface acoustic wave on the piezoelectric substrate changes with temperature in a predictable manner as well as with pressure. For the valve cap implementations, a separate SAW device can be attached to the outside of the valve cap and protected with a cover where it is subjected to the same temperature as the SAW sensors 11 or 15 but is not subject to pressure or strain. This requires that each valve cap comprise two SAW devices, one for pressure sensing and another for temperature sensing. Since the valve cap is exposed to ambient temperature, a preferred approach is to have a single device on the vehicle which measures ambient temperature outside of the vehicle passenger compartment. Many vehicles already have such a temperature sensor. For those installations where access to this temperature data is not convenient, a separate SAW temperature sensor can be mounted associated with the interrogator antenna, as illustrated below, or some other convenient place.

Although the valve cap 10 is provided with the pressure seal 16, there is a danger that the valve cap 10 will not be properly assembled onto the valve stem 2 and a small quantity of the air will leak over time. FIG. 2 provides an alternate design where the SAW temperature and pressure measuring devices are incorporated into the valve stem. This embodiment is thus particularly useful in the initial manufacture of a tire.

The valve stem assembly is shown generally at 20 and comprises a brass valve stem 7 which contains a tire valve assembly 5. The valve stem 7 is covered with a coating 21 of a resilient material such as rubber, which has been partially removed in the drawing. A metal conductive ring 22 is electrically attached to the valve stem 7. A rubber extension 23 is also attached to the lower end of the valve stem 7 and contains a SAW pressure and temperature sensor 24. The SAW pressure and temperature sensor 24 can be of at least two designs wherein the SAW sensor is used as an absolute pressure sensor as shown in FIG. 2A or an as a differential sensor based on membrane strain as shown in FIG. 2B.

In FIG. 2A, the SAW sensor 24 comprises a capsule 32 having an interior chamber in communication with the interior of the tire via a passageway 30. A SAW absolute pressure sensor 27 is mounted onto one side of a rigid membrane or separator 31 in the chamber in the capsule 32. Separator 31 divides the interior chamber of the capsule 32 into two compartments 25 and 26, with only compartment 25 being in flow communication with the interior of the tire. The SAW absolute pressure sensor 27 is mounted in compartment 25 which is exposed to the pressure in the tire through passageway 30. A SAW temperature sensor 28 is attached to the other side of the separator 31 and is exposed to the pressure in compartment 26. The pressure in compartment 26 is unaffected by the tire pressure and is determined by the atmospheric pressure when the device was manufactured and the effect of temperature on this pressure. The speed of sound on the SAW temperature sensor 28 is thus affected by temperature but not by pressure in the tire.

The operation of SAW sensors 27 and 28 is discussed elsewhere more fully but briefly, since SAW sensor 27 is affected by the pressure in the tire, the wave which travels along the substrate is affected by this pressure and the time delay between the transmission and reception of a wave can be correlated to the pressure. Similarly, since SAW sensor 28 is affected by the temperature in the tire, the wave which travels along the substrate is affected by this temperature and the time delay between the transmission and reception of a wave can be correlated to the temperature.

FIG. 2B illustrates an alternate configuration of sensor 24 where a flexible membrane 33 is used instead of the rigid separator 31 shown in the embodiment of FIG. 2A, and a SAW device is mounted on flexible member 33. In this embodiment, the SAW temperature sensor 28 is mounted to a different wall of the capsule 32. A SAW device 29 is thus affected both by the strain in membrane 33 and the absolute pressure in the tire. Normally, the strain effect will be much larger with a properly designed membrane 33.

The operation of SAW sensors 28 and 29 is discussed elsewhere more fully but briefly, since SAW sensor 28 is affected by the temperature in the tire, the wave which travels along the substrate is affected by this temperature and the time delay between the transmission and reception of a wave can be correlated to the temperature. Similarly, since SAW sensor 29 is affected by the pressure in the tire, the wave which travels along the substrate is affected by this pressure and the time delay between the transmission and reception of a wave can be correlated to the pressure.

In both of the embodiments shown in FIG. 2A and FIG. 2B, a separate temperature sensor is illustrated. This has two advantages. First, it permits the separation of the temperature effect from the pressure effect on the SAW device. Second, it permits a measurement of tire temperature to be recorded. Since a normally inflated tire can experience excessive temperature caused, for example, by an overload condition, it is desirable to have both temperature and pressure measurements of each vehicle tire The SAW devices 27, 28 and 29 are electrically attached to the valve stem 7 which again serves as an antenna to transmit radio frequency information to an interrogator. This electrical connection can be made by a wired connection; however, the impedance between the SAW devices and the antenna may not be properly matched. An alternate approach as described in Varadan, V. K. et al., "Fabrication, characterization and testing of wireless MEMS-IDT based microaccelerometers" Sensors and Actuators A 90 (2001) p. 7-19, 2001 Elsevier Netherlands, incorporated herein by reference, is to inductively couple the SAW devices to the brass tube.

Although an implementation into the valve stem and valve cap examples have been illustrated above, an alternate approach is to mount the SAW temperature and pressure monitoring devices elsewhere within the tire. Similarly, although the tire stem in both cases above serves the antenna, in many implementations, it is preferable to have a separately designed antenna mounted within or outside of the vehicle tire. For example, such an antenna can project into the tire from the valve stem or can be separately attached to the tire or tire rim either inside or outside of the tire. In some cases, it can be mounted on the interior of the tire on the sidewall.

Figure 3A:
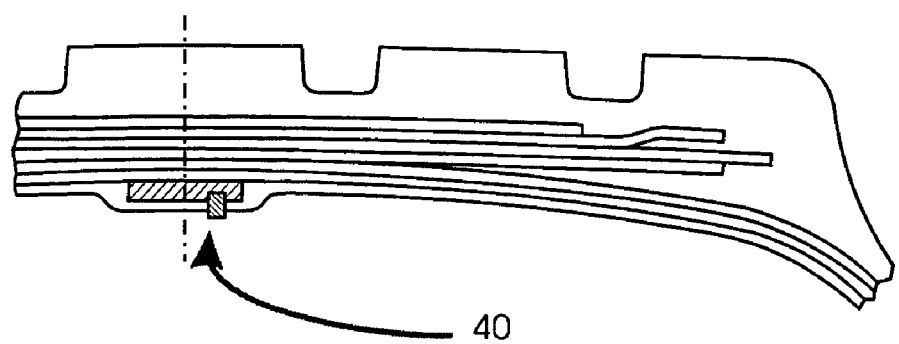
FIG. 3A is a view of an accelerometer-based tire monitor also incorporating a SAW pressure and temperature monitor and inserted into the tire opposite the tread during manufacture.
Figure 3:
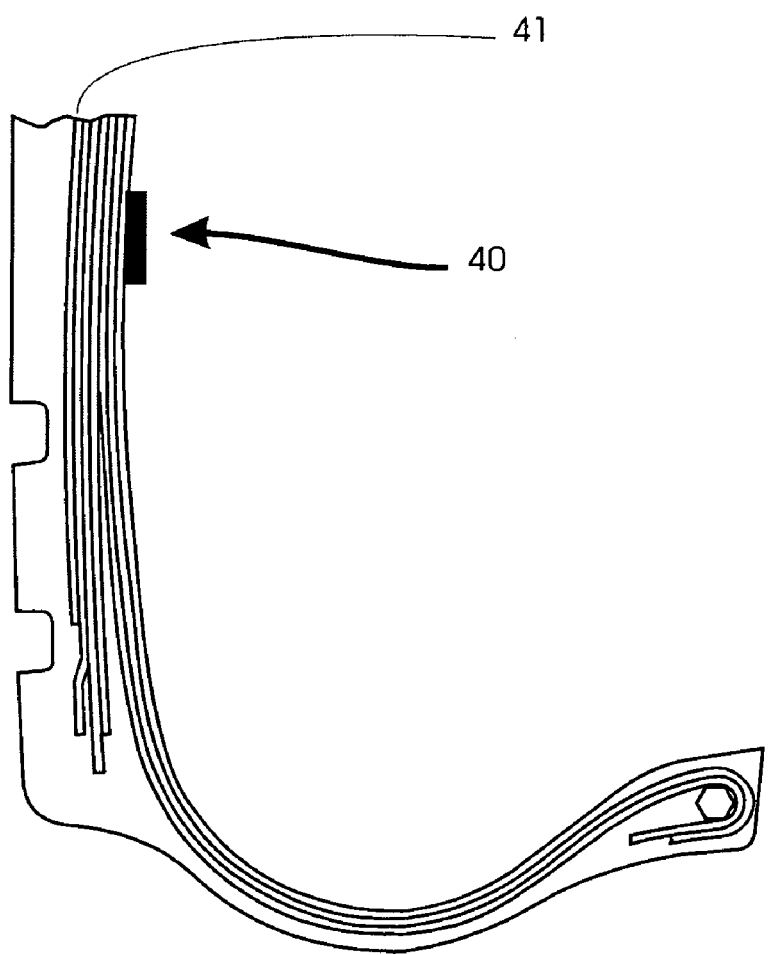
FIG. 3 is a view of an accelerometer-based tire monitor also incorporating a SAW pressure and temperature monitor and cemented to the interior of the tire opposite the tread.

A more advanced embodiment of a tire monitor in accordance with the invention is illustrated generally at 40 in FIGS. 3 and 3A. In addition to temperature and pressure monitoring devices as described in the previous applications, the tire monitor assembly 40 comprises an accelerometer of any of the types to be described below which is configured to measure either or both of the tangential and radial accelerations. Tangential accelerations as used herein mean accelerations tangent to the direction of rotation of the tire and radial accelerations as used herein mean accelerations toward or away from the wheel axis. For either accelerometer case, the acceleration will be zero when the monitor assembly 40 is closest to the road and will be at a maximum when the monitor assembly 40 is at its maximum distance from the road. Both accelerations will increase and decrease at all positions in between.

In FIG. 3, the tire monitor assembly 40 is cemented to the interior of the tire opposite the tread. In FIG. 3A, the tire monitor assembly 40 is inserted into the tire opposite the tread during manufacture.

Superimposed on the acceleration signals will be vibrations introduced into tire from road interactions and due to tread separation and other defects. Additionally, the presence of the nail or other object attached to the tire will, in general, excite vibrations that can be sensed by the accelerometers. When the tread is worn to the extent that the wire belts 41 begin impacting the road, additional vibrations will be induced.

Through monitoring the acceleration signals from the tangential or radial accelerometers within the tire monitor assembly 40, delamination, a worn tire condition, imbedded nails, other debris attached to the tire tread, hernias, can all be sensed. Additionally, as previously discussed, the length of time that the tire tread is in contact with the road opposite tire monitor 40 can be measured and, through a comparison with the total revolution time, the length of the tire footprint on the road can be determined. This permits the load on the tire to be measured, thus providing an indication of excessive tire loading. As discussed above, a tire can fail due to over loading even when the tire interior temperature and pressure are within acceptable limits. Other tire monitors cannot sense such conditions.

Since the acceleration changes during the rotation of the tire, a simple switch containing an acceleration sensing mass can now be designed that would permit data transmission only during one part of the tire rotation. Such a switch can be designed, for example, such that it shorts out the antenna except when the tire is experiencing zero acceleration at which time it permits the device to transmit data to the interrogator. Such a system would save on battery power, for example, for powered systems and minimize bandwidth use for passive systems.

In the discussion above, the use of the tire valve stem as an antenna has been discussed. An antenna can also be placed within the tire when the tire sidewalls are not reinforced with steel. In some cases and for some frequencies, it is sometimes possible to use the tire steel bead or steel belts as an antenna, which in some cases can be coupled to inductively. Alternately, the antenna can be designed integral with the tire beads or belts and optimized and made part of the tire during manufacture.

Although the discussion above has centered on the use of SAW devices, the configuration of FIG. 3 can also be effectively accomplished with other pressure, temperature and accelerometer sensors. One of the advantages of using SAW devices is that they are totally passive thereby eliminating the requirement of a battery. For the implementation of tire monitor assembly 40, the changes in acceleration can also be used to generate sufficient electrical energy to power a silicon microcircuit. In this configuration, additional devices, typically piezoelectric devices, are used as a generator of electricity that can be stored in one or more conventional capacitors or ultra-capacitors. Naturally, other types of electrical generators can be used such as those based on a moving coil and a magnetic field etc. A PVDF piezoelectric polymer can also be used to generate electrical energy based on the flexure of the tire as described below.

Figure 4:
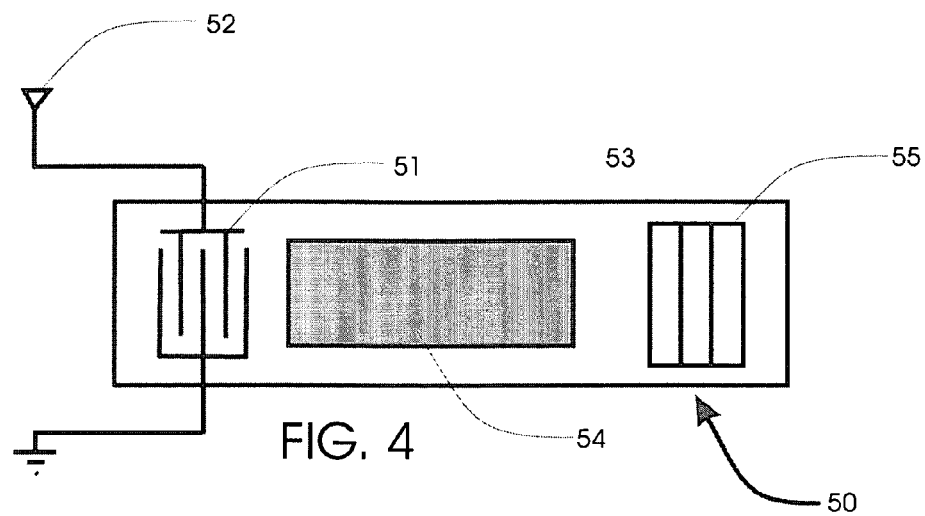
FIG. 4 is a detailed view of a polymer on SAW pressure sensor.

FIG. 4 illustrates an absolute pressure sensor based on surface acoustic wave (SAW) technology. A SAW absolute pressure sensor 50 has an interdigital transducer (IDT) 51 which is connected to antenna 52. Upon receiving an RF signal of the proper frequency, the antenna induces a surface acoustic wave in the material 53 which can be lithium niobate, quartz, zinc oxide, or other appropriate piezoelectric material. As the wave passes through a pressure sensing area 54 formed on the material 53, its velocity is changed depending on the air pressure exerted on the sensing area 54. The wave is then reflected by reflectors 55 where it returns to the IDT 51 and to the antenna 52 for retransmission back to the interrogator. The material in the pressure sensing area 54 can be a thin (such as one micron) coating of a polymer that absorbs or reversibly reacts with oxygen or nitrogen where the amount absorbed depends on the air density. The material in the pressure sensing area 54 can also be a rubber such as silicone rubber or other elastomeric material which serves to couple the air pressure to the surface acoustic wave device. The material of pressure sensing area 54 can either make the device more or less sensitive to air pressure changes depending on the properties of material.

Figure 4A:
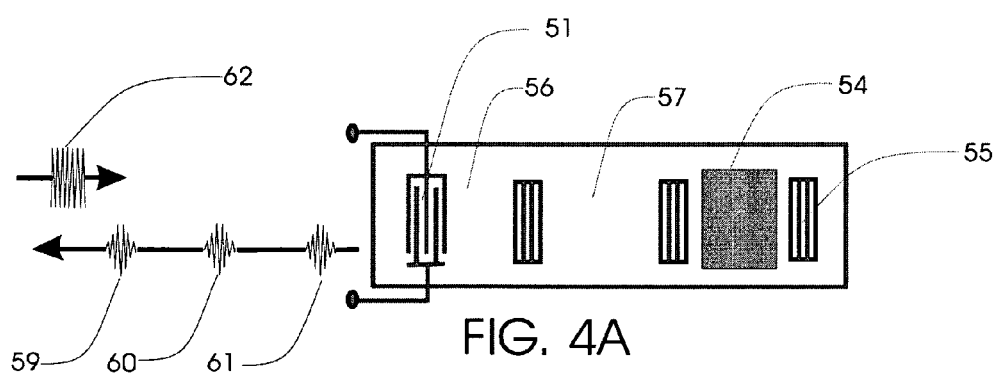
FIG. 4A is a view of a SAW temperature and pressure monitor on a single SAW device.

In FIG. 4A, two additional sections of the SAW device, designated 56 and 57, are provided such that the air pressure affects sections 56 and 57 differently than pressure sensing area 54. This is achieved by providing three reflectors. The three reflecting areas cause three reflected waves to appear, 59, 60 and 61 when input wave 62 is provided. The spacing between waves 59 and 60, and between waves 60 and 61 provides a measure of the pressure. This construction of a pressure sensor may be utilized in the embodiments of FIGS. 1A-3 or in any embodiment wherein a pressure measurement by a SAW device is obtained.

Figure 4B:
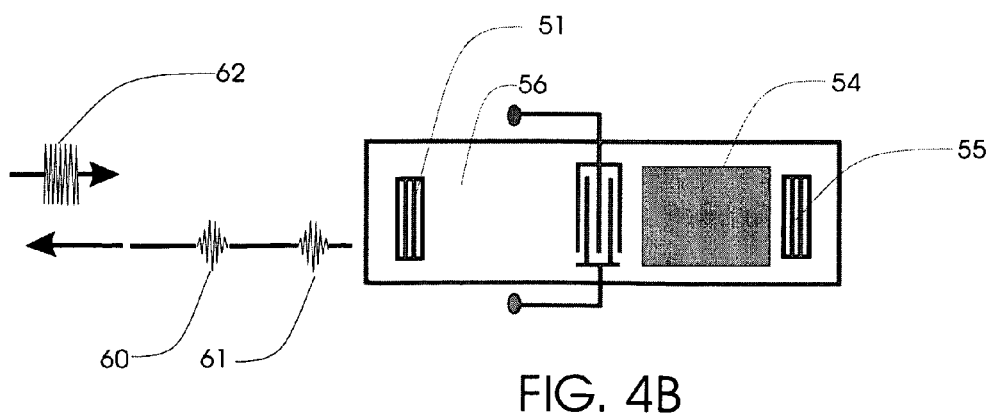
FIG. 4B is a view of an alternate design of a SAW temperature and pressure monitor on a single SAW device.

There are many other ways in which the pressure can be measured based on either the time between reflections or on the frequency or phase change of the SAW device as is well known to those skilled in the art. FIG. 4B, for example, illustrates an alternate SAW geometry where only two sections are required to measure both temperature and pressure. This construction of a temperature and pressure sensor may be utilized in the embodiments of FIGS. 1A-3 or in any embodiment wherein both a pressure measurement and a temperature measurement by a single SAW device is obtained.

Another method where the speed of sound on a piezoelectric material can be changed by pressure was first reported in Varadan et al., "Local/Global SAW Sensors for Turbulence" referenced above. This, phenomenon has not been applied to solving pressure sensing problems within an automobile until now. The instant invention is believed to be the first application of this principle to measuring tire pressure, oil pressure, coolant pressure, pressure in a gas tank, etc. Experiments to date, however, have been unsuccessful.

In some cases, a flexible membrane is placed loosely over the SAW device to prevent contaminants from affecting the SAW surface. The flexible membrane permits the pressure to be transferred to the SAW device without subjecting the surface to contaminants. Such a flexible membrane can be used in most if not all of the embodiments described herein.

Figure 5B:
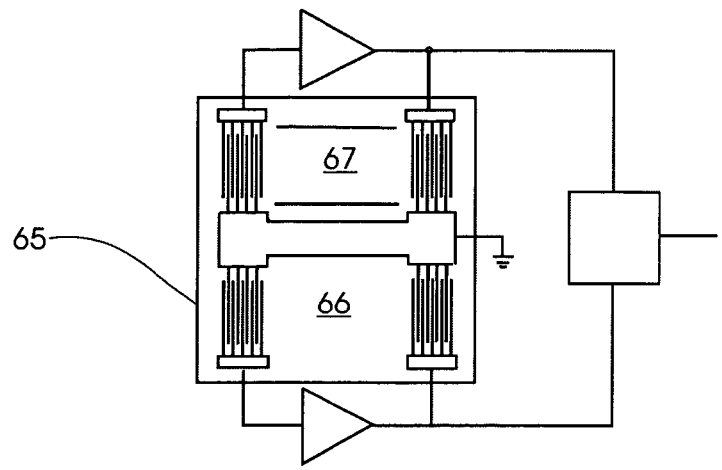
FIG. 5B is a top view of an alternate SAW device capable of determining two physical or chemical properties such as pressure and temperature.
Figure 5A:
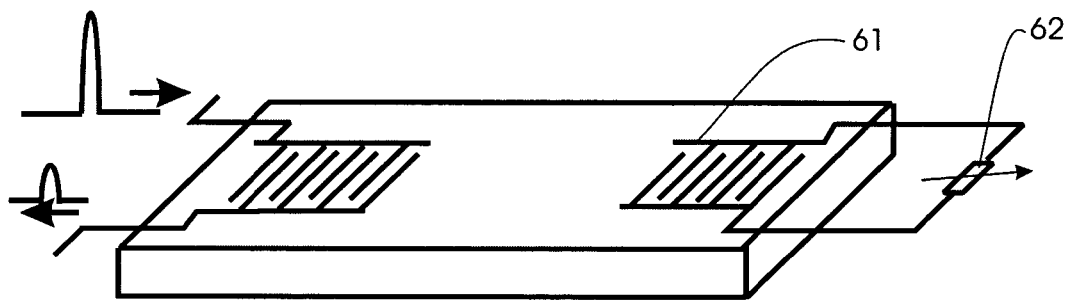
FIG. 5A is a perspective view of a device that can provide two measurements of temperature or one of temperature and another of some other physical or chemical property such as pressure or chemical concentration.
Figure 5:
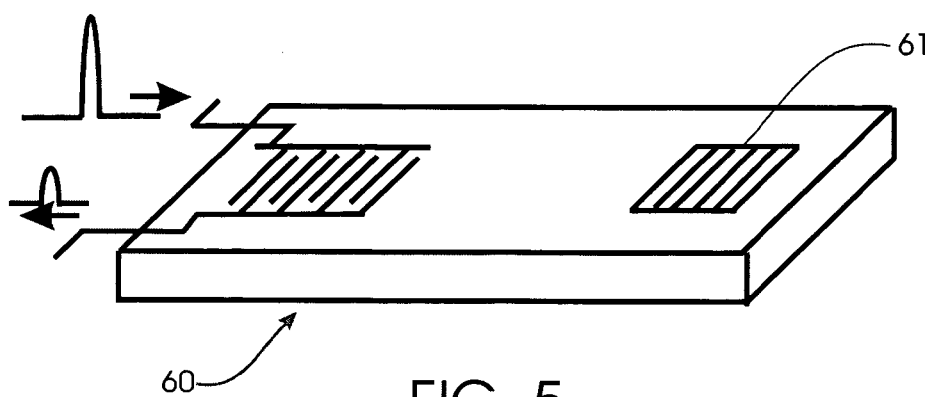
FIG. 5 is a perspective view of a SAW temperature sensor.

A SAW temperature sensor 60 is illustrated in FIG. 5. Since the SAW material, such as lithium niobate, expands significantly with temperature, the natural frequency of the device also changes. Thus, for a SAW temperature sensor to operate, a material for the substrate is selected which changes its properties as a function of temperature, i.e., expands. Similarly, the time delay between the insertion and retransmission of the signal also varies measurably. Since speed of a surface wave is typically 100,000 times slower then the speed of light, usually the time for the electromagnetic wave to travel to the SAW device and back is small in comparison to the time delay of the SAW wave and therefore the temperature is approximately the time delay between transmitting electromagnetic wave and its reception.

An alternate approach as illustrated in FIG. 5A is to place a thermistor 62 across an interdigital transducer (IDT) 61, which is now not shorted as it was in FIG. 5. In this case, the magnitude of the returned pulse varies with the temperature. Thus, this device can be used to obtain two independent temperature measurements, one based on time delay or natural frequency of the device 60 and the other based on the resistance of the thermistor 62.

When some other property such as pressure is being measured by the device 65 as shown in FIG. 5B, two parallel SAW devices are commonly used. These devices are designed so that they respond differently to one of the parameters to be measured. Thus, SAW device 66 and SAW device 67 can be designed to both respond to temperature and respond to pressure. However, SAW device 67, which contains a surface coating, will respond differently to pressure than SAW device 66. Thus, by measuring natural frequency or the time delay of pulses inserted into both SAW devices 66 and 67, a determination can be made of both the pressure and temperature, for example. Naturally, the device which is rendered sensitive to pressure in the above discussion could alternately be rendered sensitive to some other property such as the presence or concentration of a gas, vapor, or liquid chemical as described in more detail below.

Figure 6A:
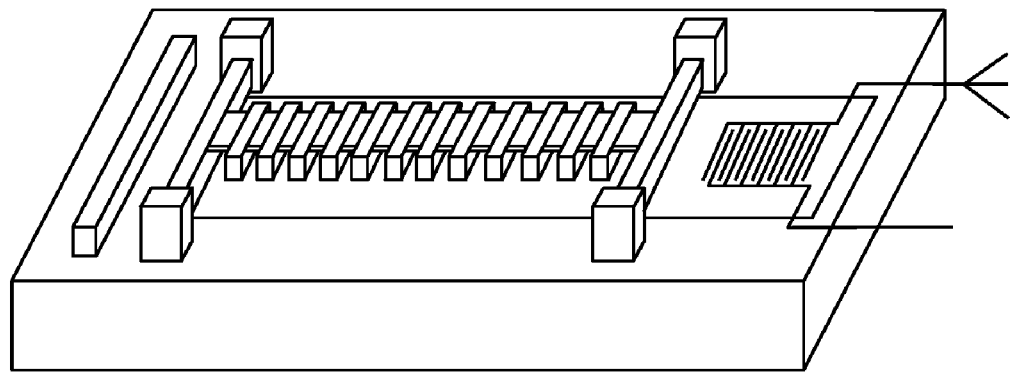
FIGS. 6 and 6A are views of a prior art SAW accelerometer that can be used for the tire monitor assembly of FIG. 3.
Figure 6:
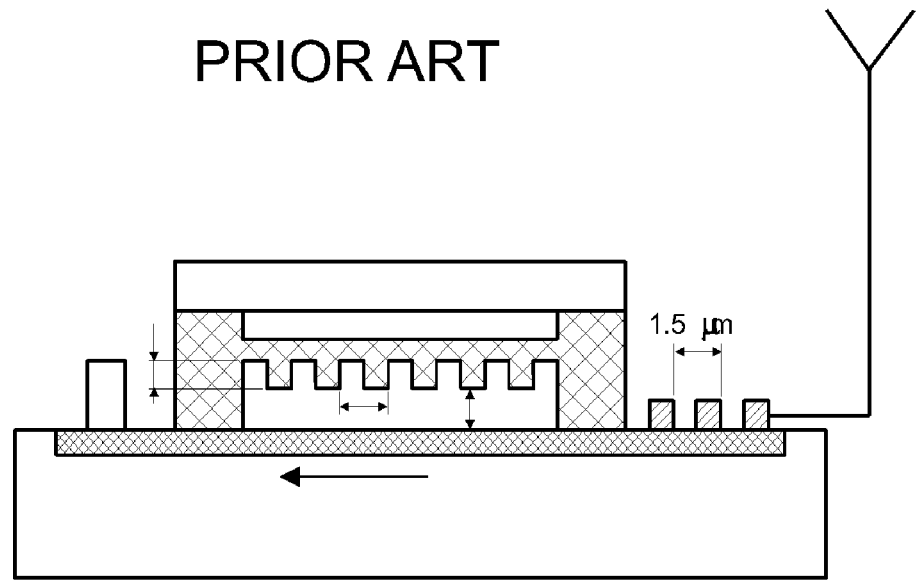

An accelerometer that can be used for either radial or tangential acceleration in the tire monitor assembly of FIG. 3 is illustrated in FIGS. 6 and 6A. The design of this accelerometer is explained in detail in Varadan, V. K. et al., "Fabrication, characterization and testing of wireless MEMS-IDT based microaccelerometers" referenced above, which is incorporated in its entirety herein by reference, and will not be repeated herein.

Figure 7A:
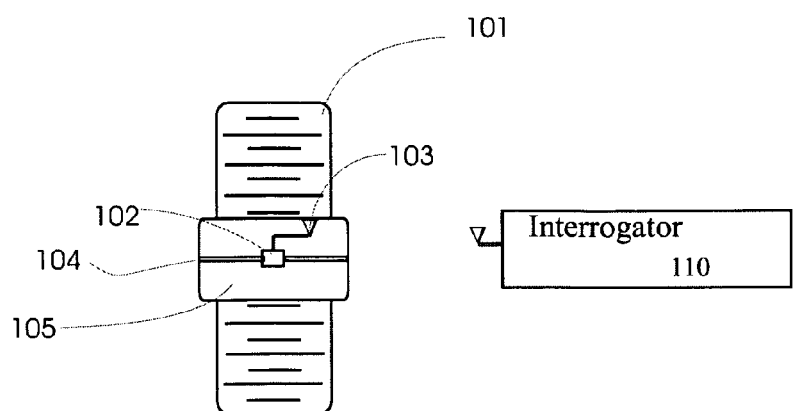
FIGS. 7A, 7B, 7C and 7D are views of occupant seat weight sensors using a slot spanning SAW strain gage and other strain concentrating designs.

A stud which is threaded on both ends and which can be used to measure the weight of an occupant seat is illustrated in FIGS. 7A-7D. The operation of this device is disclosed in U.S. patent application Ser. No. 09/849,558, now U.S. Pat. No. 6,653,577, wherein the center section of stud 101 is solid. It has been discovered that sensitivity of the device can be significantly improved if a slotted member is used as described in U.S. Pat. No. 5,539,236, which is incorporated herein by reference. FIG. 7A illustrates a SAW strain gage 102 mounted on a substrate and attached to span a slot 104 in a center section 105 of the stud 101. This technique can be used with any other strain-measuring device.

Figure 7B:
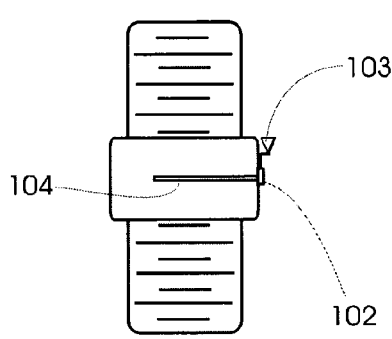

FIG. 7B is a side view of the device of FIG. 7A.

Figure 7C:
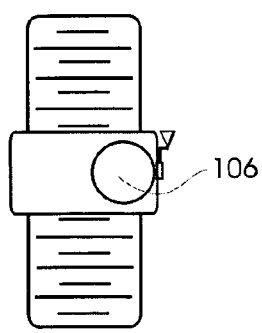

FIG. 7C illustrates use of a single hole 106 drilled off-center in the center section 105 of the stud 101. A single hole 106 also serves to magnify the strain as sensed by the strain gage 102. It has the advantage in that strain gage 102 does not need to span an open space. The amount of magnification obtained from this design, however, is significantly less than obtained with the design of FIG. 7A.

Figure 7D:
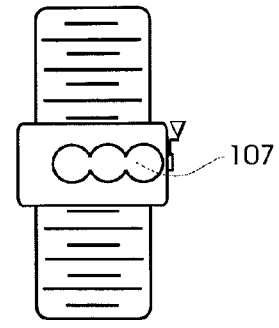

To improve the sensitivity of the device shown in FIG. 7C, multiple smaller holes 107 can be used as illustrated in FIG. 7D.

In operation, the SAW strain gage 102 receives radio frequency waves from an interrogator 110 and returns electromagnetic waves via a respective antenna 103 which are delayed based on the strain sensed by strain gage 102.

Figure 8A:
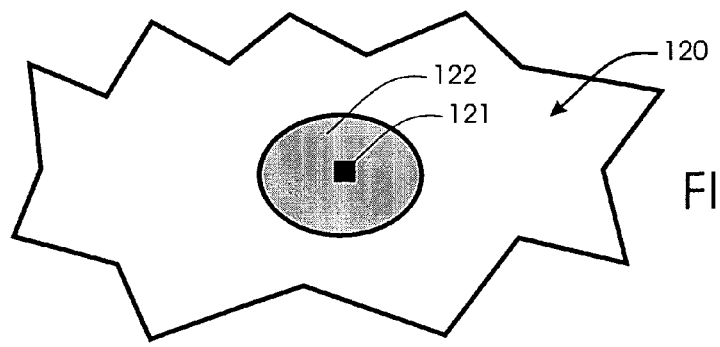
FIG. 8A is a view of a view of a SAW switch sensor for mounting on or within a surface such as a vehicle armrest.
Figure 8B:
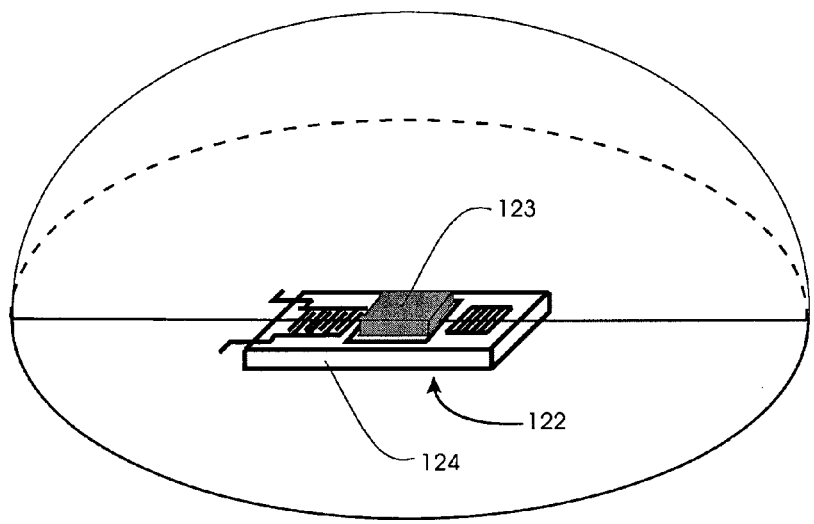
FIG. 8B is a detailed perspective view of the device of FIG. 8A with the force-transmitting member rendered transparent.

A SAW device can also be used as a wireless switch as shown in FIGS. 8A and 8B. FIG. 8A shows a surface 120 containing a projection 122 on top of a SAW device 121. Surface material 120 could be, for example, the armrest of an automobile, the steering wheel airbag cover, or any other surface within the passenger compartment of an automobile or elsewhere. Projection 122 will typically be a material which is capable of transmitting force to the surface of SAW device 121. As shown in FIG. 8B, a projection 123 may be placed on top of the SAW device 124. This projection 123 permits force exerted on the projection 122 to create a pressure on the SAW device 124. This increased pressure changes the time delay or natural frequency of the SAW wave traveling on the surface of material. Alternately, it can affect the magnitude of the retuned signal. The projection 123 is typically held slightly out of contact with the surface until forced into contact with it.

Figure 8C:
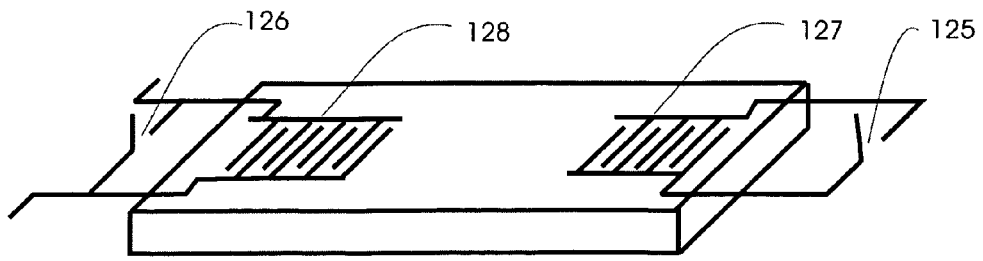
FIG. 8C is a detailed perspective view of an alternate SAW device for use in FIGS. 8A and 8B showing the use of one of two possible switches, one that activates the SAW and the other that suppresses the SAW.

An alternate approach is to place a switch across the IDT 127 as shown in FIG. 8C. If switch 125 is open, then the device will not return a signal to the interrogator. If it is closed, than the IDT 127 will act as a reflector sending a single back to IDT 128 and thus to the interrogator. Alternately, a switch 126 can be placed across the SAW device. In this case, a switch closure shorts the SAW device and no signal is returned to the interrogator. For the embodiment of FIG. 8C, using switch 126 instead of switch 125, a standard reflector IDT would be used in place of the IDT 127.

Figure 9A:
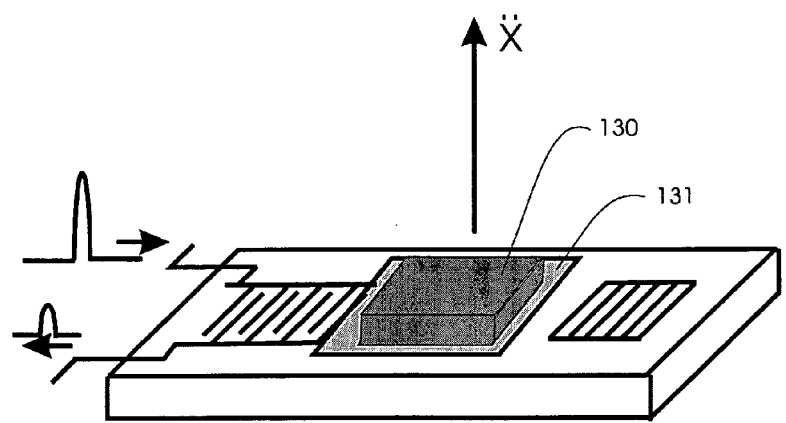
FIG. 9A is a detailed perspective view of a polymer and mass on SAW accelerometer for use in crash sensors, vehicle navigation, etc.
Figure 9B:
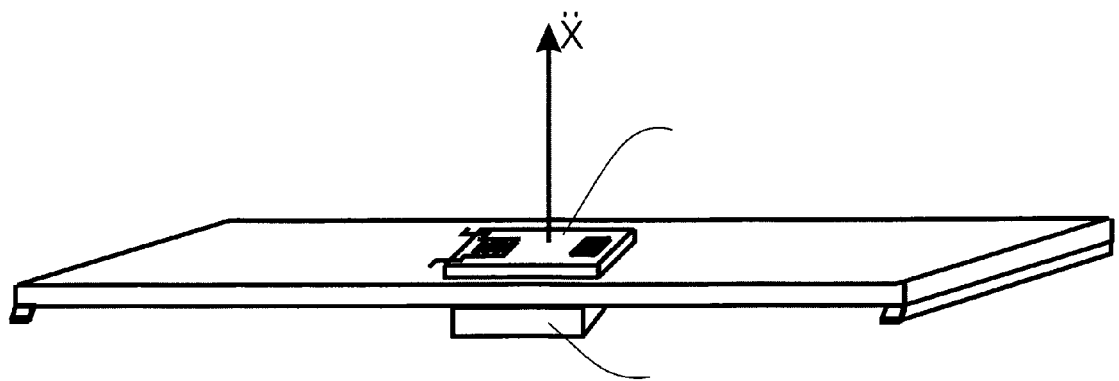
FIG. 9B is a detailed perspective view of a normal mass on SAW accelerometer for use in crash sensors, vehicle navigation, etc.

Most SAW-based accelerometers work on the principle of straining the SAW surface and thereby changing either the time delay or natural frequency of the system. An alternate novel accelerometer is illustrated FIG. 9A wherein a mass 130 is attached to a silicone rubber coating 131 which has been applied the SAW device. Acceleration of the mass in FIG. 9 in the direction of arrow X changes the amount of rubber in contact with the surface of the SAW device and thereby changes the damping, natural frequency or the time delay of the device. By this method, accurate measurements of acceleration below 1 G are readily obtained. Furthermore, this device can withstand high deceleration shocks without damage. The device acts a similar manner as the pressure sensors described above where mass provides the source of pressure. FIG. 9B illustrates a more conventional approach where the strain in a beam 137 caused by the acceleration acting on a mass 136 is measured with a SAW strain sensor 135.

It is important to note that all of these devices have a high dynamic range compared with most competitive technologies. In some cases, this dynamic range can exceed 100,000. This is the direct result of the ease with which frequency and phase can be accurately measured.

Figure 10:
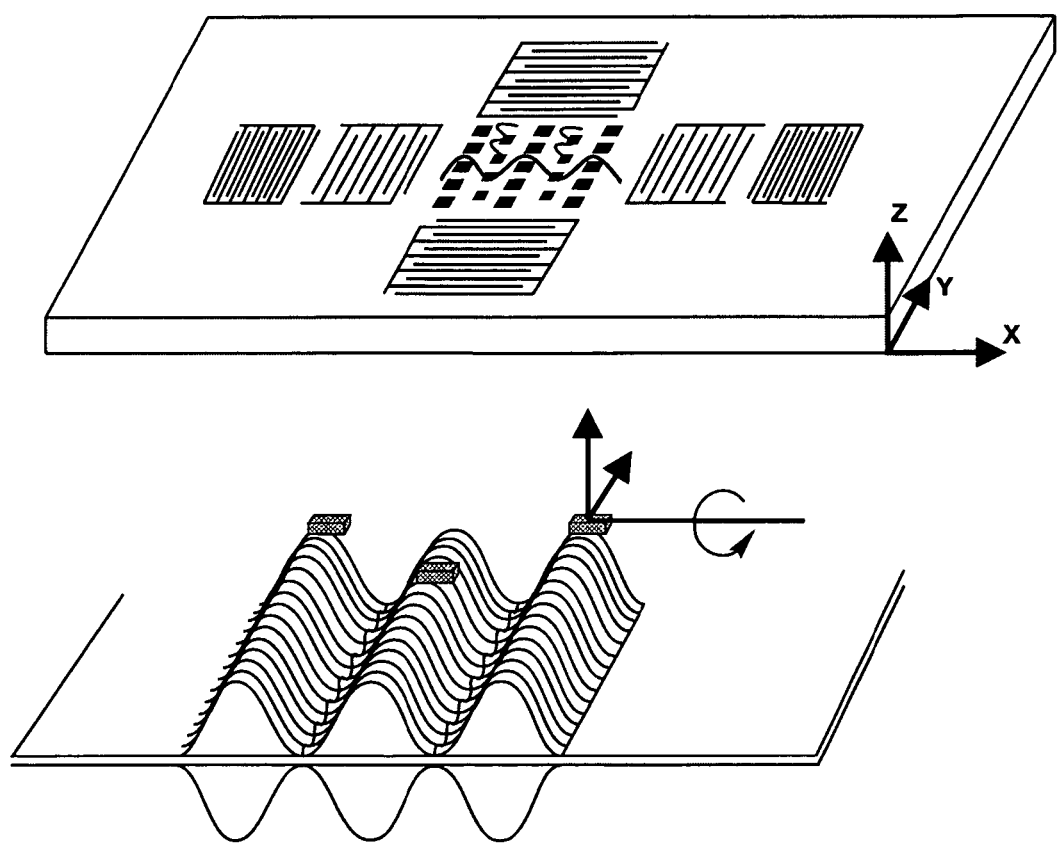
FIG. 10 is a view of a prior art SAW gyroscope that can be used with this invention.

A gyroscope, which is suitable for automotive applications, is illustrated in FIG. 10 and described in detail in V. K. Varadan's International Application No. WO 00/79217, which is incorporated by reference herein in its entirety. This SAW-based gyroscope has applicability for the vehicle navigation, dynamic control, and rollover sensing among others.

Note that any of the disclosed applications can be interrogated by the central interrogator of this invention and can either be powered or operated powerlessly as described in general above. Block diagrams of three interrogators suitable for use in this invention are illustrated in FIGS. 11A-11C. FIG. 11A illustrates a superheterodyne circuit and FIG. 1B illustrates a dual superheterodyne circuit. FIG. 11C operates as follows. During the burst time two frequencies, F1 and F1+F2, are sent by the transmitter after being generated by mixing using oscillator Osc. The two frequencies are needed by the SAW transducer where they are mixed yielding F2 which is modulated by the SAW and contains the information. Frequency (F1+F2) is sent only during the burst time while frequency F1 remains on until the signal F2 returns from the SAW. This signal is used for mixing. The signal returned from the SAW transducer to the interrogator is F1+F2 where F2 has been modulated by the SAW transducer. It is expected that the mixing operations will result in about 12 db loss in signal strength.

Figure 12:
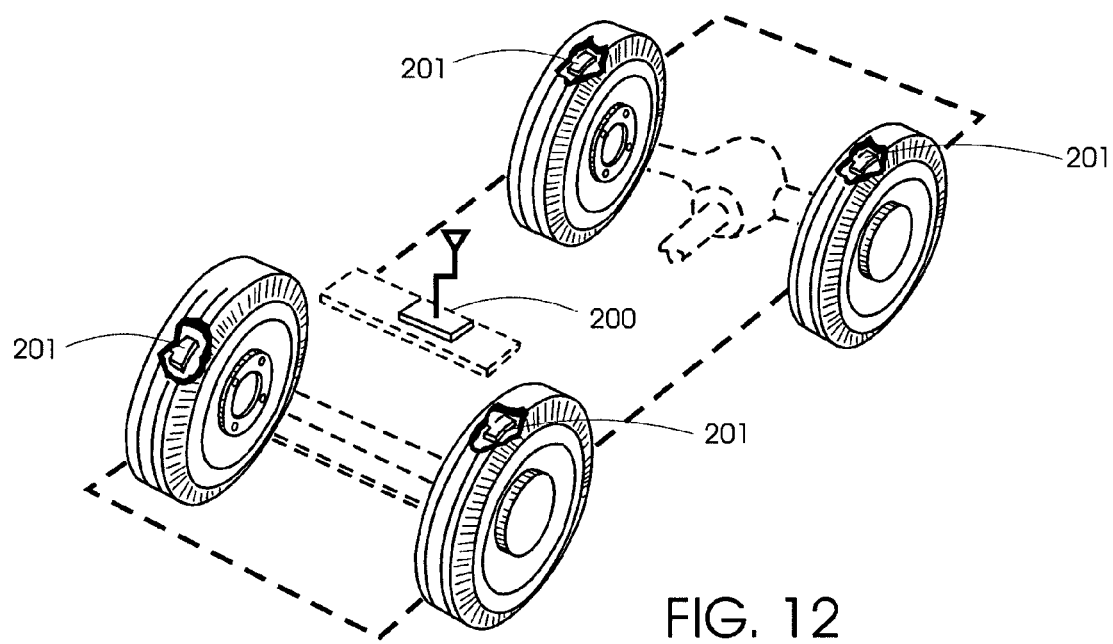
FIG. 12 is a perspective view of a SAW antenna system adapted for mounting underneath a vehicle and for communicating with the four mounted tires.

FIG. 12 illustrates a central antenna mounting arrangement for permitting interrogation of the tire monitors for four tires and is similar to that described in U.S. Pat. No. 4,237,728, which is incorporated by reference herein. An antenna package 200 is mounted on the underside of the vehicle and communicates with devices 201 through their antennas as described above. In order to provide for antennas both inside (for example for weight sensor interrogation) and outside of the vehicle, another antenna assembly (not shown) can be mounted on the opposite side of the vehicle floor from the antenna assembly 200.

Figure 12A:
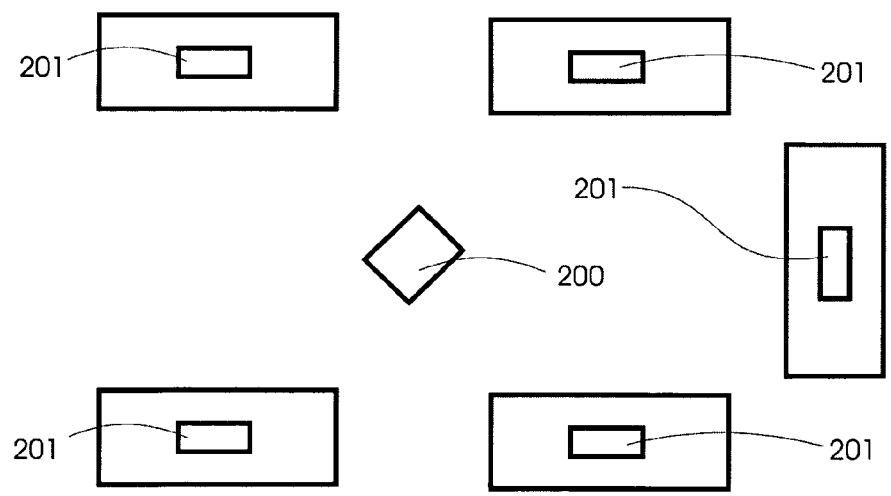
FIG. 12A is a detail view of an antenna system for use in the system of FIG. 12.

FIG. 12A is a schematic of the vehicle shown in FIG. 12. The antenna package 200, which can be considered as an electronics module, contains a time domain multiplexed antenna array that sends and receives data from each of the five tires (including the spare tire), one at a time. It comprises a microstrip or stripline antenna array and a microprocessor on the circuit board. The antennas that face each tire are in an X configuration so that the transmissions to and from the tire can be accomplished regardless of the tire rotation angle.

Figure 13:
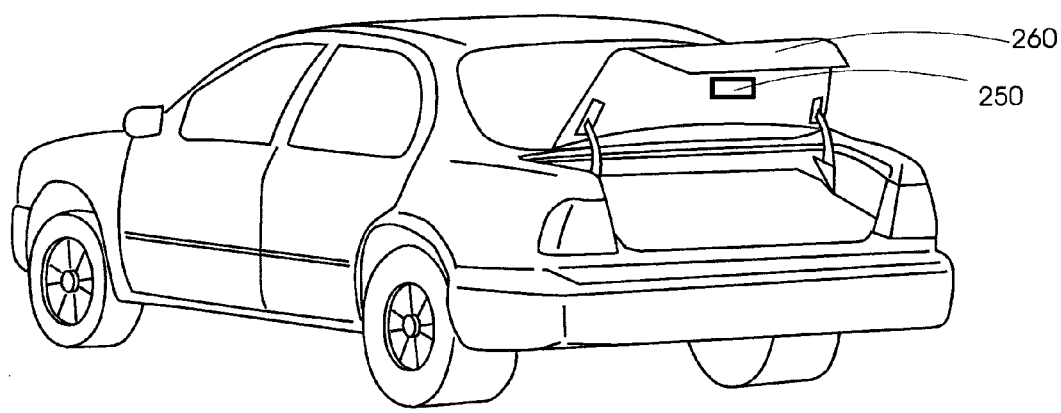
FIG. 13 is a perspective view of a carbon dioxide SAW sensor for mounting in the trunk lid for monitoring the inside of the trunk for detecting trapped children or animals.
Figure 13A:
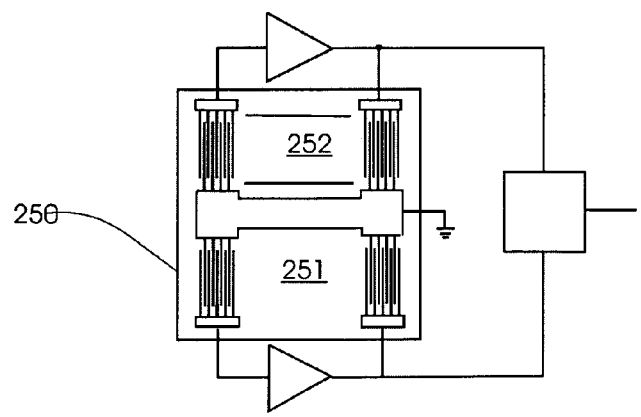
FIG. 13A is a detailed view of the SAW carbon dioxide sensor of FIG. 13.

A chemical sensor 250 similar to the sensor of FIG. 5B is illustrated in FIG. 13A for mounting in a vehicle trunk as illustrated in FIG. 13. The chemical sensor 250 is designed to measure carbon dioxide concentration through the mass loading effects as described in U.S. Pat. No. 4,895,017, which is incorporated by reference herein, with a polymer coating selected that is sensitive to carbon dioxide. The speed of the surface acoustic wave is a function of the carbon dioxide level in the atmosphere. Section 252 of the SAW device contains a coating of such a polymer and the acoustic velocity in this section is a measure of the carbon dioxide concentration. Temperature effects are eliminated through a comparison of the sonic velocities in sections 251 and 252 as described above.

Thus, when trunk lid 260 is closed and a source of carbon dioxide such as a child or animal is trapped within the trunk, the chemical sensor 250 will provide information indicating the presence of the carbon dioxide producing object to the interrogator which can then release the trunk lock permitting trunk to automatically open. In this manner, the problem of children and animals suffocating in closed trunks is eliminated.

A similar device can be distributed at various locations within the passenger compartment of vehicle along with a combined temperature sensor. If the car has been left with a child or other animal while owner is shopping, for example, and if the temperature rises within the vehicle to an unsafe level or, alternately, if the temperature drops below an unsafe level, then the vehicle can be signaled to take appropriate action which may involve opening the windows or starting the vehicle with either air conditioning or heating as appropriate. Thus, through these simple wireless powerless sensors, the problem of suffocation either from lack of oxygen or death from excessive heat or cold can all be solved in a simple, low-cost manner through using the same interrogator as used for other devices such as tire monitoring.

Additionally, a sensitive layer on a SAW can be made to be sensitive to other chemicals such as water vapor for humidity control or alcohol for drunk driving control. Similarly, the sensitive layer can be designed to be sensitive to carbon monoxide thereby preventing carbon monoxide poisoning. Many other chemicals can be sensed for specific applications such as to check for chemical leaks in commercial vehicles, for example. Whenever such a sensor system determines that a dangerous situation is developing, an alarm can be sounded and/or the situation can be automatically communicated to an off vehicle location through telematics, a cell phone such as a 911 call, the Internet or though a subscriber service such as OnStar®.

Based on the frequency and power available, and on FCC limitations, SAW devices can be designed to permit transmission distances of up to 100 feet or more. Since SAW devices can measure both temperature and humidity, they are also capable of monitoring road conditions in front of and around a vehicle. Thus, a properly equipped vehicle can determine the road conditions prior to entering a particular road section if such SAW devices are embedded in the road surface or on mounting structures close to the road surface as shown at 279 in FIG. 14. Such devices could provide advance warning of freezing conditions, for example. Although at 60 miles per hour, such devices may only provide a one second warning, this can be sufficient to provide information to a driver, or to an automatic control or guidance system which controls the movement of the vehicle, to prevent dangerous skidding. Additionally, since the actual temperature and humidity can be reported, the driver will be warned prior to freezing of the road surface.

SAW device 279 is shown in FIG. 14A. Optional components of a sensor including the SAW device 279 or another type of physical property measuring or detecting sensor are also shown, which may also be provided to SAW device 283 discussed below. These optional components include a proximity sensor 272 which can sense a vehicle within a predetermined threshold distance from the SAW device 279, i.e., to define an area proximate the SAW device 279, and is arranged to cause the SAW device 279 or other sensor to perform its measurement. As such, the SAW device 279 or other sensor could transmit the information about the measured property to the vehicle as it approaches the SAW device 279 or other sensor. Another optional component is an energy harvesting system 274 which, when the SAW device 279 or other sensor requires energy to operate, functions to provide such energy, e.g., electricity. The energy harvesting system could generate electricity from, for example, vibratory and solar sources.

Furthermore, the determination of freezing conditions of the roadway could also be transmitted to a remote location, such as a road monitoring or maintenance facility or traffic monitoring facility, where such information is collected and processed. All information about roadways in a selected area could be collected by the roadway maintenance department and used to dispatch snow removal vehicles, salting/sanding equipment and the like. To this end, the interrogator would be coupled to a communications device arranged on the vehicle and capable of transmitting information via a satellite, ground station, over the Internet and via other communications means. A communications channel could also be established to enable bi-directional communications between the remote location and the vehicle.

The information about the roadway obtained from the sensors by the vehicle could be transmitted to the remote location along with data on the location of the vehicle, obtained through a location-determining system possibly using GPS technology. Additional information, such as the status of the sensors, the conditions of the environment obtained from vehicle-mounted or roadway-infrastructure-mounted sensors, the conditions of the vehicle obtained from vehicle-mounted sensors, the occupants obtained from vehicle-mounted sensors, etc., could also be transmitted by the vehicle's transmission device or communications device to receivers at one or more remote locations. Such receivers could be mounted to roadway infrastructure or on another vehicle. In this manner, a complete data package of information obtained by a single vehicle could be disseminated to other vehicles, traffic management locations, road condition management facilities and the like. So long as a single vehicle equipped with such a system is within range of each sensor mounted in the roadway or along the roadway, information about the entire roadway can be obtained and the entire roadway monitored.

Figure 15:
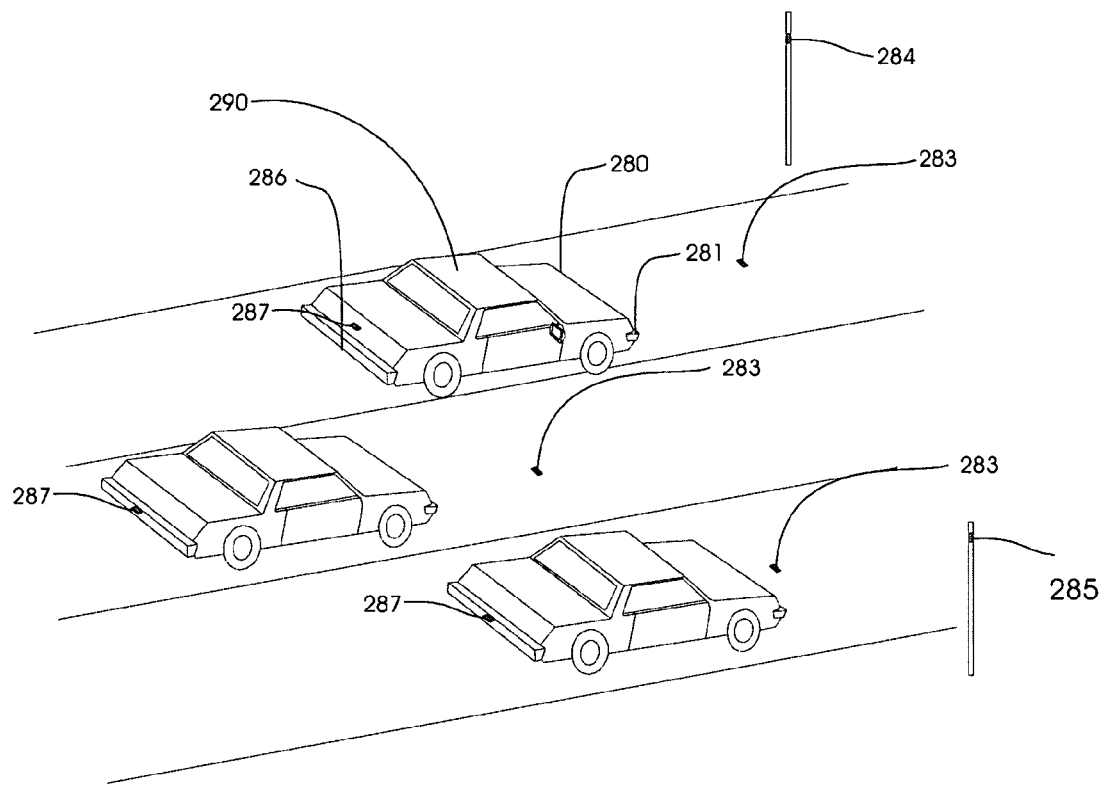
FIG. 15 is a perspective view of a SAW system for locating a vehicle on a roadway, and on the earth surface if accurate maps are available. It also illustrates the use of a SAW transponder in the license plate for the location of preceding vehicles and preventing rear end impacts.

If a SAW device 283 is placed in a roadway, possible embedded in the roadway or arranged in a housing embedded or attached to the roadway, as illustrated in FIG. 15, and if a vehicle 290 has two receiving antennas 280 and 281, an interrogator can transmit a signal from either of the two antennas and at a later time, the two antennas will receive the transmitted signal from the SAW device. By comparing the arrival time of the two received pulses, the position of vehicle on a lane can be precisely determined (since the direction from each antenna 280, 281 to the SAW device 283 can be calculated). If the SAW device 283 has an identification code encoded into the returned signal generated thereby, then the vehicle 290 can determine, providing a precise map is available, its position on the surface of the earth. If another antenna 286 is provided, for example, at the rear of the vehicle 290 then the longitudinal position of the vehicle can also be accurately determined as the vehicle passes the SAW device 283. Of course the SAW device 283 need not be in the center of the road. Alternate locations for positioning of the SAW device 283 are on overpasses above the road and on poles such as 284 and 285 on the roadside. Such a system has an advantage over a competing system using radar and reflectors in that it is easier to measure the relative time between the two received pulses than it is to measure time of flight of a radar signal to a reflector and back. Such a system operates in all weather conditions and is known as a precise location system. Eventually such a SAW device 283 can be placed every tenth of a mile along the roadway or at some other appropriate spacing.

As noted in U.S. patent application Ser. No. 09/679,317, now U.S. Pat. No. 6,405,132, in some locations where weather conditions can deteriorate and degrade road surface conditions, various infrastructure-based sensors, of which SAW sensors 283 are examples, can be placed either in or adjacent to the road surface. As described therein, a subsystem is provided on the vehicle and designed to interrogate and obtained information from such road-based systems. An example of such a road-based system would be an RFID tag containing a temperature sensor, e.g., a SAW temperature sensor. This device may be battery-powered or, preferably, would receive its power from energy harvesting (e.g., solar energy, vibratory energy), the vehicle-mounted interrogator, or other host vehicle-mounted source, as the vehicle passes nearby the device. In this manner, the vehicle can obtain the temperature of the road surface and receive advanced warning when the temperature is approaching conditions which could cause icing of the roadway, for example. An RFID based on a surface acoustic wave (SAW) device is one preferred example of such a sensor, see U.S. Pat. No. 6,662,642. An infrared sensor on the vehicle can also be used to determine the road temperature and the existence of ice or snow.

In one embodiment, SAW devices 283, in any arrangement shown for example in FIG. 15, are provided with a proximity sensor to sense the presence of a vehicle 290. In this case, when the proximity sensor determines that a vehicle is approaching, it can perform a measurement of, for example, the temperature of the roadway, and transmit that information to the vehicle. For example, the SAW device 283 could obtain a measurement of the temperature of the roadway in advance of receiving a signal from the vehicle-mounted interrogator and then when it receives the signal from the vehicle-mounted interrogator, it would have temperature data readily available.

If a vehicle is being guided by a DGPS and accurate map system such as disclosed in U.S. patent application Ser. No. 09/679,317, now U.S. Pat. No. 6,405,132, a problem arises when the GPS receiver system looses satellite lock as would happen when the vehicle enters a tunnel, for example. If a precise location system as described above is placed at the exit of the tunnel then the vehicle will know exactly where it is and can re-establish satellite lock in as little as one second rather than typically 15 seconds as might otherwise be required. Other methods making use of the cell phone system can be used to establish an approximate location of the vehicle suitable for rapid acquisition of satellite lock as described in G. M. Djuknic, R. E. Richton "Geolocation and Assisted GPS", Computer Magazine, February 2001, IEEE Computer Society, which is incorporated by reference herein in its entirety.

More particularly, geolocation technologies that rely exclusively on wireless networks such as time of arrival, time difference of arrival, angle of arrival, timing advance, and multipath fingerprinting offer a shorter time-to-first-fix (TTFF) than GPS. They also offer quick deployment and continuous tracking capability for navigation applications, without the added complexity and cost of upgrading or replacing any existing GPS receiver in vehicles. Compared to either mobile-station-based, stand-alone GPS or network-based geolocation, assisted-GPS (AGPS) technology offers superior accuracy, availability, and coverage at a reasonable cost. AGPS for use with vehicles would comprise a communications unit with a partial GPS receiver arranged in the vehicle, an AGPS server with a reference GPS receiver that can simultaneously "see" the same satellites as the communications unit, and a wireless network infrastructure consisting of base stations and a mobile switching center. The network can accurately predict the GPS signal the communication unit will receive and convey that information to the mobile, greatly reducing search space size and shortening the TTFF from minutes to a second or less. In addition, an AGPS receiver in the communication unit can detect and demodulate weaker signals than those that conventional GPS receivers require. Because the network performs the location calculations, the communication unit only needs to contain a scaled-down GPS receiver. It is accurate within about 15 meters when they are outdoors, an order of magnitude more sensitive than conventional GPS.

Because an AGPS server can obtain the vehicle's position from the mobile switching center, at least to the level of cell and sector, and at the same time monitor signals from GPS satellites seen by mobile stations, it can predict the signals received by the vehicle for any given time. Specifically, the server can predict the Doppler shift due to satellite motion of GPS signals received by the vehicle, as well as other signal parameters that are a function of the vehicle's location. In a typical sector, uncertainty in a satellite signal's predicted time of arrival at the vehicle is about ±5 µs, which corresponds to ±5 chips of the GPS coarse acquisition (C/A) code. Therefore, an AGPS server can predict the phase of the pseudorandom noise (PRN) sequence that the receiver should use to despread the C/A signal from a particular satellite—each GPS satellite transmits a unique PRN sequence used for range measurements—and communicate that prediction to the vehicle. The search space for the actual Doppler shift and PRN phase is thus greatly reduced, and the AGPS receiver can accomplish the task in a fraction of the time required by conventional GPS receivers. Further, the AGPS server maintains a connection with the vehicle receiver over the wireless link, so the requirement of asking the communication unit to make specific measurements, collect the results, and communicate them back is easily met. After despreading and some additional signal processing, an AGPS receiver returns back "pseudoranges"—that is, ranges measured without taking into account the discrepancy between satellite and receiver clocks—to the AGPS server, which then calculates the vehicle's location. The vehicle can even complete the location fix itself without returning any data to the server.

Sensitivity assistance, also known as modulation wipe-off, provides another enhancement to detection of GPS signals in the vehicle's receiver. The sensitivity-assistance message contains predicted data bits of the GPS navigation message, which are expected to modulate the GPS signal of specific satellites at specified times. The mobile station receiver can therefore remove bit modulation in the received GPS signal prior to coherent integration. By extending coherent integration beyond the 20-ms GPS data-bit period-to a second or more when the receiver is stationary and to 400 ms when it is fast-moving—this approach improves receiver sensitivity. Sensitivity assistance provides an additional 3-to-4-dB improvement in receiver sensitivity. Because some of the gain provided by the basic assistance—code phases and Doppler shift values—is lost when integrating the GPS receiver chain into a mobile system, this can prove crucial to making a practical receiver.

Achieving optimal performance of sensitivity assistance in TIA/EIA-95 CDMA systems is relatively straightforward because base stations and mobiles synchronize with GPS time. Given that global system for mobile communication (GSM), time division multiple access (TDMA), or advanced mobile phone service (AMPS) systems do not maintain such stringent synchronization, implementation of sensitivity assistance and AGPS technology in general will require novel approaches to satisfy the timing requirement. The standardized solution for GSM and TDMA adds time calibration receivers in the field—location measurement units—that can monitor both the wireless-system timing and GPS signals used as a timing reference.

Many factors affect the accuracy of geolocation technologies, especially terrain variations such as hilly versus flat and environmental differences such as urban versus suburban versus rural. Other factors, like cell size and interference, have smaller but noticeable effects. Hybrid approaches that use multiple geolocation technologies appear to be the most robust solution to problems of accuracy and coverage.

AGPS provides a natural fit for hybrid solutions because it uses the wireless network to supply assistance data to GPS receivers in vehicles. This feature makes it easy to augment the assistance-data message with low-accuracy distances from receiver to base stations measured by the network equipment. Such hybrid solutions benefit from the high density of base stations in dense urban environments, which are hostile to GPS signals. Conversely, rural environments—where base stations are too scarce for network-based solutions to achieve high accuracy—provide ideal operating conditions for AGPS because GPS works well there.

SAW transponders can also be placed in the license plates 287 (FIG. 15) of all vehicles at nominal cost. An appropriately equipped automobile can then determine the angular location of vehicles in its vicinity. If a third antenna 286 is placed at the center of the vehicle front, then an indication of the distance to a license plate of a preceding vehicle can also be obtained as described above. Thus, once again, a single interrogator coupled with multiple antenna systems can be used for many functions. Alternately, if more than one SAW transponder is placed spaced apart on a vehicle and if two antennas are on the other vehicle, then the direction and position of the SAW vehicle can be determined by the receiving vehicle.

A system in accordance with the invention could be designed to enhance other vehicle safety systems (as more fully described in U.S. patent application Ser. No. 09/679,317, now U.S. Pat. No. 6,405,132). In particular, by knowing the location and velocity of other vehicles, for those cases where an accident cannot be avoided, the RtZF® system will in general be able to anticipate a crash and assessment the crash severity using, for example, neural network technology. Even with a limited implementation of the RtZF® system, a significant improvement in smart airbag technology results when used in conjunction with a collision avoidance system such as described in Shaw (U.S. Pat. Nos. 5,314,037 and 5,529,138) and a neural network anticipatory sensing algorithm such as disclosed in U.S. Pat. No. 6,343,810. A further enhancement would be to code a vehicle-to-vehicle communication signal from RtZF® system-equipped vehicles with information that includes the size and approximate weight of the vehicle. Then, if an accident is inevitable, the severity can also be accurately anticipated and the smart airbag tailored to the pending event. Information on the type, size and mass of a vehicle can also be implemented as an RFID tag and made part of the license plate. The type can indicate a vehicle having privileges such as an ambulance, fire truck or police vehicle.

Transponders are contemplated by the inventors to include SAW, RFID or other technologies, reflective or back scattering antennas, polarization antennas, rotating antennas, corner cube or dihedral reflectors etc. that can be embedded within the roadway or placed on objects beside the roadway, in vehicle license plates, for example. An interrogator within the vehicle transmits power to the transponder and receives a return signal. Alternately, as disclosed in the '317 application, the responding device can have its own source of power so that the vehicle-located interrogator need only receive a signal in response to an initiated request. The source of power can be a battery, connection to an electric power source such as an AC circuit, solar collector, or in some cases, the energy can be harvested from the environment where vibrations, for example, are present. The range of a license-mounted transponder, for example, can be greatly increased if such a vibration-based energy harvesting system is incorporated.

Figure 15A:
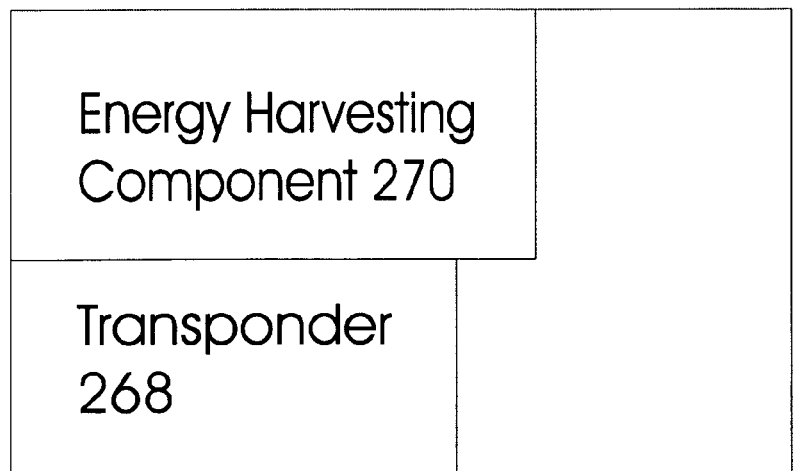
FIG. 15A is a view showing a license plate having a transponder in accordance with the invention.

In view of the foregoing, a license plate 287 for a vehicle in accordance with the invention could include a plate having an indicia and arranged to be mounted on the vehicle, as a conventional license plate, and a transponder 268 arranged in the license plate 287 (see FIG. 15A). The transponder 268 is arranged to receive a signal from an interrogator, e.g., a vehicle-mounted interrogator or infrastructure-mounted interrogator, modify the received signal and transmit the modified signal to the interrogator. The transponder 268 may be a SAW transponder, an RFID transponder, include a reflective or back scattering antenna, a polarization antenna, a rotating antenna, or a corner cube or dihedral reflector, etc., as mentioned above. Further, an energy harvesting component 270 can be arranged in connection with the license plate 287 for providing power to the license plate-mounted transponder 268. The energy harvesting component 270 may be arranged to generate energy during or from movement or vibration of the vehicle 290. Another construction of a license plate 287 includes a plate having indicia and arranged to be mounted on the vehicle and an RFID tag (as transponder 268) arranged as part of the license plate 287. The RFID tag is arranged to respond to an activation signal and provide the type, size and mass of the vehicle to which the license plate 287 is mounted. The type of vehicle may be an indication of whether the vehicle has special travel privileges.

Figure 16:
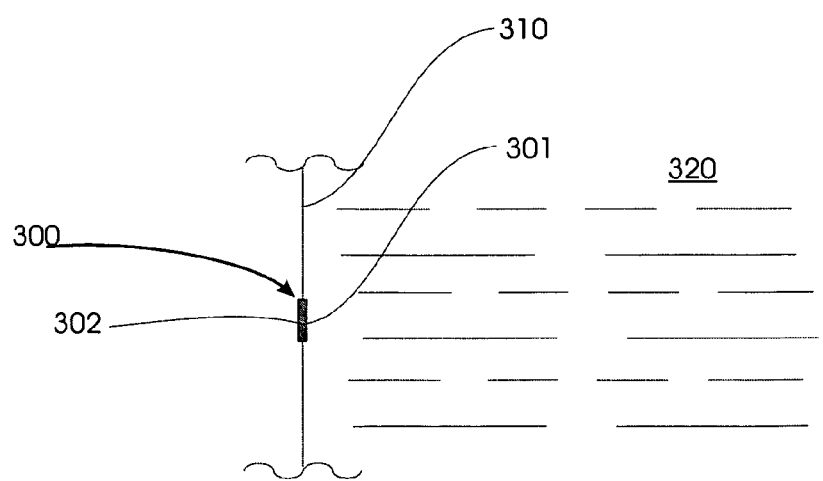
FIG. 16 is a partial cutaway view of a section of a fluid reservoir with a SAW fluid pressure and temperature sensor for monitoring oil, water, or other fluid pressure.

A general SAW temperature and pressure gage which can be wireless and powerless is shown generally at 300 located in the sidewall 310 of a fluid container 320 in FIG. 16. A pressure sensor 301 is located on the inside of the container 320, where it measures deflection of the container wall, and the fluid temperature sensor 302 on the outside. The temperature measuring SAW 300 can be covered with an insulating material to avoid influence from the ambient temperature outside of the container 320.

A SAW load sensor can also be used to measure load in the vehicle suspension system powerless and wirelessly as shown in FIG. 17. FIG. 17A illustrates a strut 315 such as either of the rear struts of the vehicle of FIG. 17. A coil spring 320 stresses in torsion as the vehicle encounters disturbances from the road and this torsion can be measured using SAW strain gages as described in U.S. Pat. No. 5,585,571 for measuring the torque in shafts. This concept is also disclosed in U.S. Pat. No. 5,714,695. The disclosures of both patents are incorporated herein by reference. The use of SAW strain gages to measure the torsional stresses in a spring, as shown in FIG. 17B, and in particular in an automobile suspension spring has, to the knowledge of the inventors, not been heretofore disclosed. In FIG. 17B, the strain measured by SAW strain gage 322 is subtracted from the strain measured by SAW strain gage 321 to get the temperature compensated strain in spring 320.

Since a portion of the dynamic load is also carried by the shock absorber, the SAW strain gages 321 and 322 will only measure the steady or average load on the vehicle. However, additional SAW strain gages 325 can be placed on a piston rod 326 of the shock absorber to obtain the dynamic load. These load measurements can then be used for active or passive vehicle damping or other stability control purposes.

Figure 18:
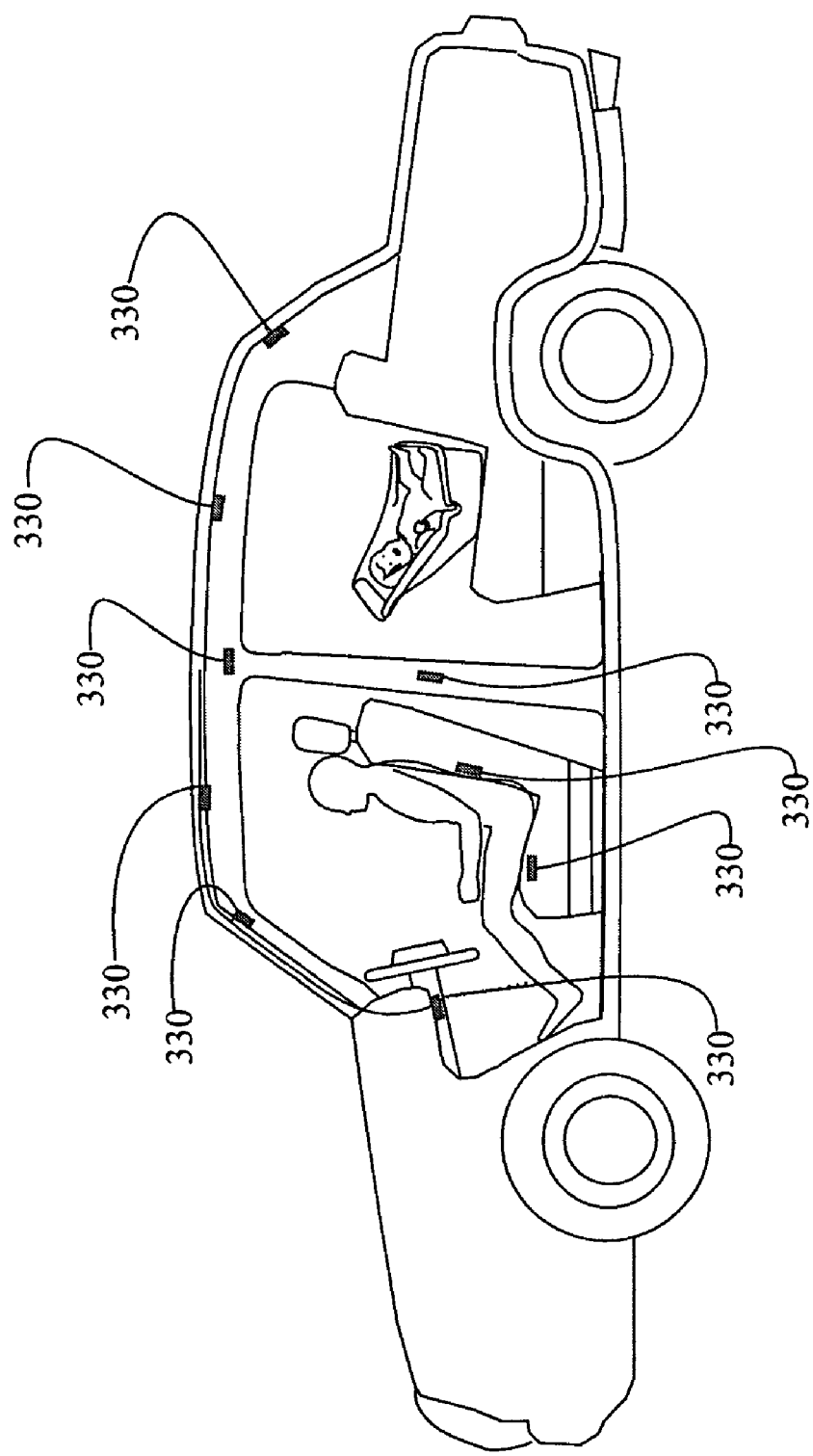
FIG. 18 is a cutaway view of a vehicle showing possible mounting locations for vehicle interior temperature, humidity, carbon dioxide, carbon monoxide, alcohol or other chemical or physical property measuring sensors.

FIG. 18 illustrates a vehicle passenger compartment, and the engine compartment, with multiple SAW temperature sensors 330. SAW temperature sensors are distributed throughout the passenger compartment, such as on the A-pillar, on the B-pillar, on the steering wheel, on the seat, on the ceiling, on the headliner, and on the rear glass and generally in the engine compartment. These sensors, which can be independently coded with different IDs and different delays, can provide an accurate measurement of the temperature distribution within the vehicle interior. Such a system can be used to tailor the heating and air conditioning system based on the temperature at a particular location in the passenger compartment. If this system is augmented with occupant sensors, then the temperature can be controlled based on seat occupancy and the temperature at that location. If the occupant sensor system is based on ultrasonics than the temperature measurement system can be used to correct the ultrasonic occupant sensor system for the speed of sound within the passenger compartment. Without such a correction, the error in the sensing system can be as large as 20 percent.

In one case, the SAW temperature sensor can be made from PVDF film and incorporated within the ultrasonic transducer assembly. For the 40 kHz ultrasonic transducer case, for example, the SAW temperature sensor would return the several pulses sent to drive the ultrasonic transducer to the control circuitry using the same wires used to transmit the pulses to the transducer after a delay that is proportional to the temperature within the transducer housing. Thus a very economical device can add this temperature sensing function using much of the same hardware that is already present for the occupant sensing system. Since the frequency is low, PVDF could be fabricated into a very low cost temperature sensor for this purpose. Other piezoelectric materials could also be used.

Other sensors can be combined with the temperature sensors 330, or used separately, to measure carbon dioxide, carbon monoxide, alcohol, humidity or other desired chemicals as discussed above.

The SAW temperature sensors 330 provide the temperature at their mounting location to a processor unit 332 via an interrogator with the processor unit including appropriate control algorithms for controlling the heating and air conditioning system based on the detected temperatures. The processor unit can control, e.g., which vents in the vehicle are open and closed, the flow rate through vents and the temperature of air passing through the vents. In general, the processor unit can control whatever adjustable components are present or form part of the heating and air conditioning system.

As shown in FIG. 18, a child seat 334 is present on the rear vehicle seat. The child seat 334 can be fabricated with one or more RFID tags or SAW tags 336. The RFID tag(s) and SAW tag(s) can be constructed to provide information on the occupancy of the child seat, i.e., whether a child is present, based on the weight. Also, the mere transmission of waves from the RFID tag(s) or SAW tag(s) on the child seat would be indicative of the presence of a child seat. The RFID tag(s) and SAW tag(s) can also be constructed to provide information about the orientation of the child seat, i.e., whether it is facing rearward or forward. Such information about the presence and occupancy of the child seat and its orientation can be used in the control of vehicular systems, such as the vehicle airbag system. In this case, a processor would control the airbag system and would receive information from the RFID tag(s) and SAW tag(s) via an interrogator.

Figure 19A:
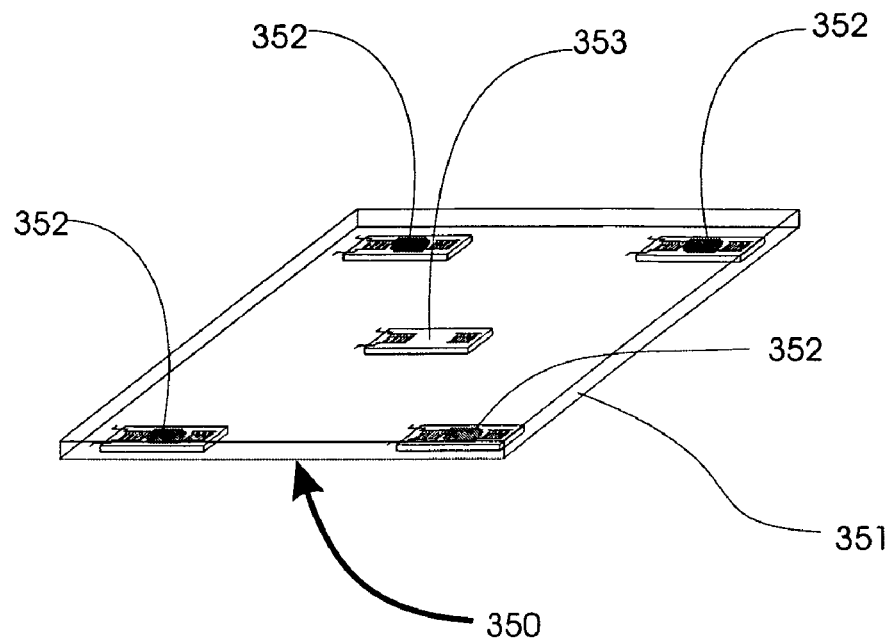
FIG. 19A is a perspective view of a SAW tilt sensor using four SAW assemblies for tilt measurement and one for temperature.
Figure 19B:
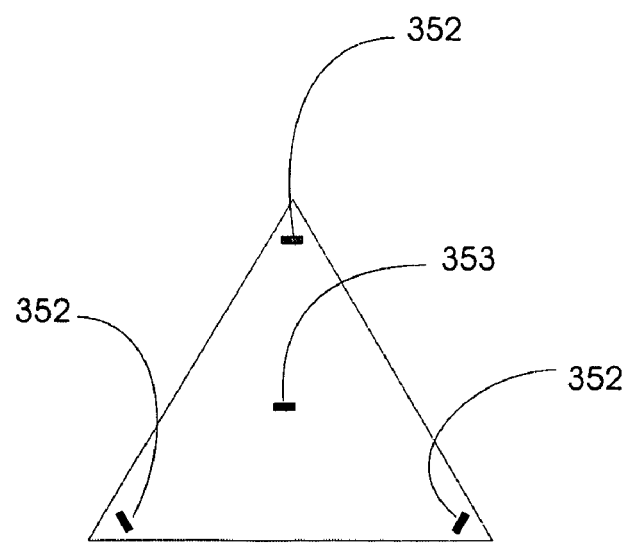
FIG. 19B is a top view of a SAW tilt sensor using three SAW assemblies for tilt measurement each one of which can also measure temperature.

There are many applications for which knowledge of the pitch and/or roll orientation of a vehicle or other object is desired. An accurate tilt sensor can be constructed using SAW devices. Such a sensor is illustrated in FIG. 19A and designated 350. This sensor 350 utilizes a substantially planar and rectangular mass 351 and four supporting SAW devices 352 which are sensitive to gravity. For example, the mass acts to deflect a membrane on which the SAW device resides thereby straining the SAW device. Other properties can also be used for a tilt sensor such as the direction of the earth's magnetic field. SAW devices 352 are shown arranged at the corners of the planar mass 351, but it must be understood that this arrangement is a preferred embodiment only and not intended to limit the invention. A fifth SAW device 353 can be provided to measure temperature. By comparing the outputs of the four SAW devices 352, the pitch and roll of the automobile can be measured. This sensor 350 can be used to correct errors in the SAW rate gyros described above. If the vehicle has been stationary for a period of time, the yaw SAW rate gyro can initialized to 0 and the pitch and roll SAW gyros initialized to a value determined by the tilt sensor of FIG. 19A. Many other geometries of tilt sensors utilizing one or more SAW devices can now be envisioned for automotive and other applications. In particular, an alternate preferred configuration is illustrated in FIG. 19B where a triangular geometry is used. In this embodiment, the planar mass is triangular and the SAW devices 352 are arranged at the corners, although as with FIG. 19A, this is a non-limiting, preferred embodiment.

Figure 20:
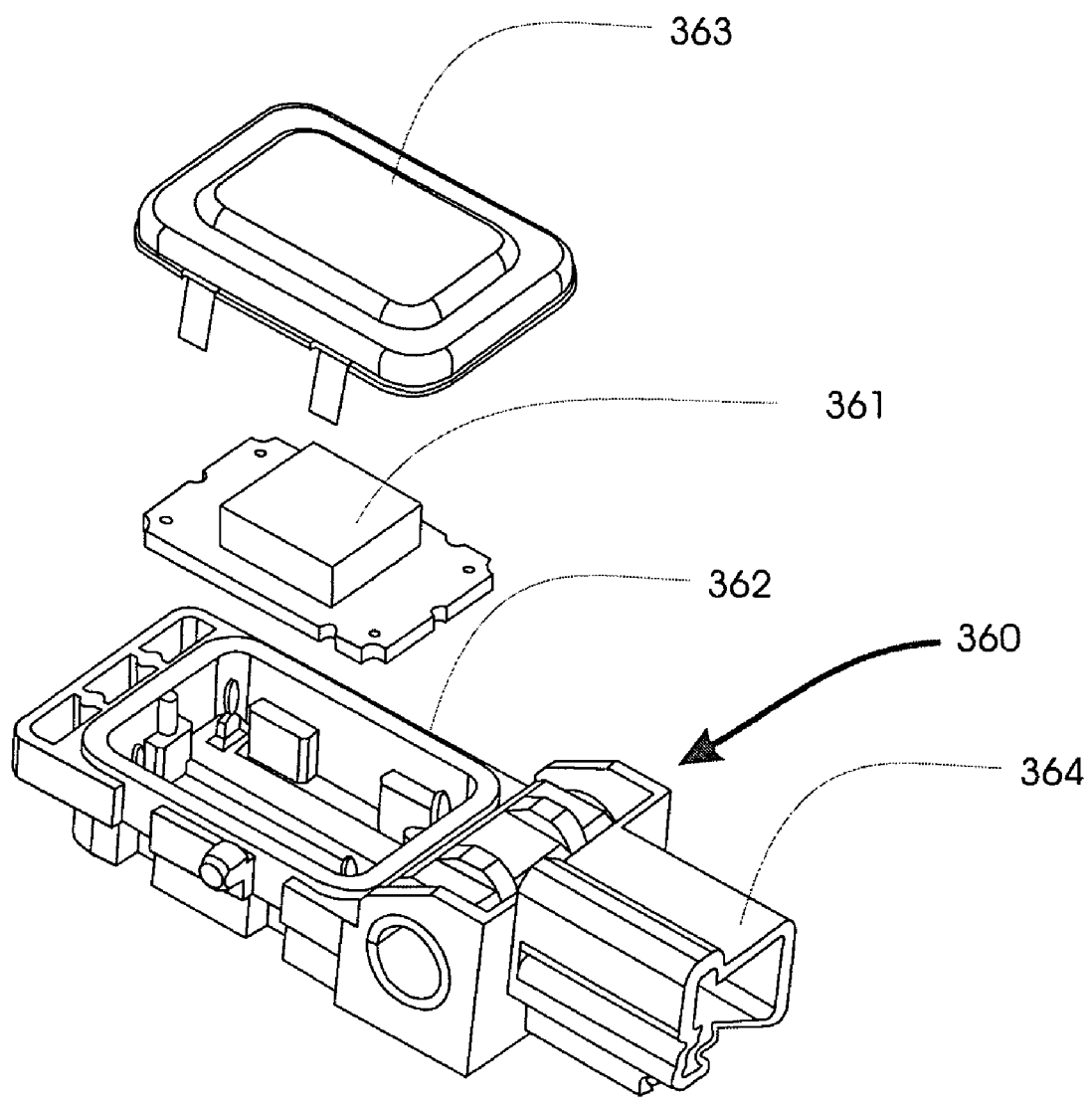
FIG. 20 is a perspective exploded view of a SAW crash sensor for sensing frontal, side or rear crashes.

Either of the SAW accelerometers described above can be utilized for crash sensors as shown in FIG. 20. These accelerometers have a substantially higher dynamic range than competing accelerometers now used for crash sensors such as those based on MEMS silicon springs and masses and others based on MEMS capacitive sensing. As discussed above, this is partially a result of the use of frequency or phase shifts which can be easily measured over a very wide range. Additionally, many conventional accelerometers that are designed for low acceleration ranges are unable to withstand high acceleration shocks without breaking. This places practical limitations on many accelerometer designs so that the stresses in the silicon springs are not excessive. Also for capacitive accelerometers, there is a narrow limit over which distance, and thus acceleration, can be measured.

The SAW accelerometer for this particular crash sensor design is housed in a container 361 which is assembled into a housing 362 and covered with a cover 363. This particular implementation shows a connector 364 indicating that this sensor would require power and the response would be provided through wires. Alternately, as discussed for other devices above, the connector 364 can be eliminated and the information and power to operate the device transmitted wirelessly. Such sensors can be used as frontal, side or rear impact sensors. They can be used in the crush zone, in the passenger compartment or any other appropriate vehicle location. If two such sensors are separated and have appropriate sensitive axes, then the angular acceleration of the vehicle can also be determined. Thus, for example, forward-facing accelerometers mounted in the vehicle side doors can used to measure the yaw acceleration of the vehicle. Alternately two vertical sensitive axis accelerometers in the side doors can be used to measure the roll acceleration of vehicle, which would be useful for rollover sensing.

Figure 21:
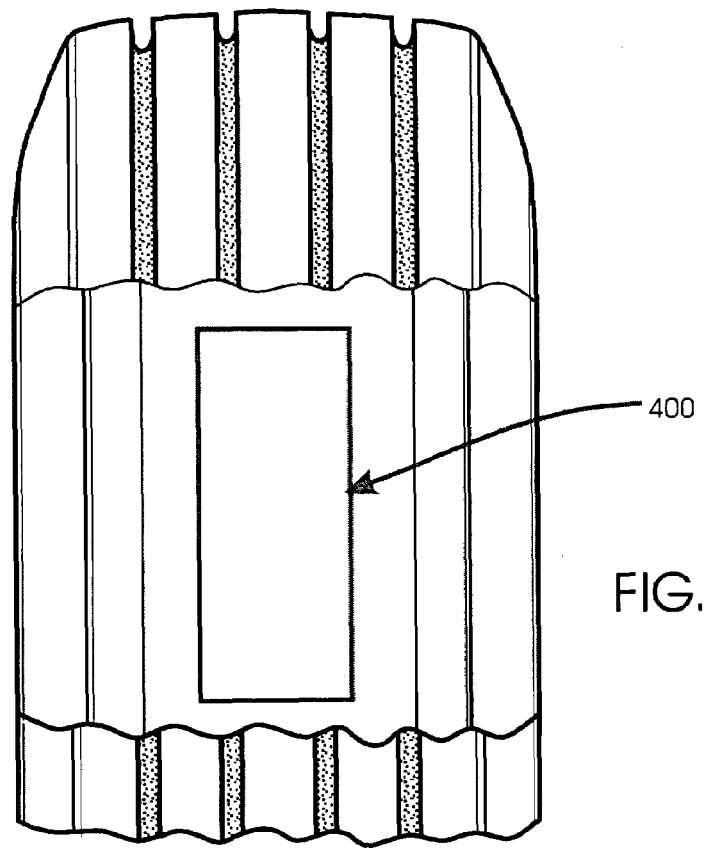
FIG. 21 is a partial cutaway view of a piezoelectric generator and tire monitor using PVDF film.
Figure 21A:
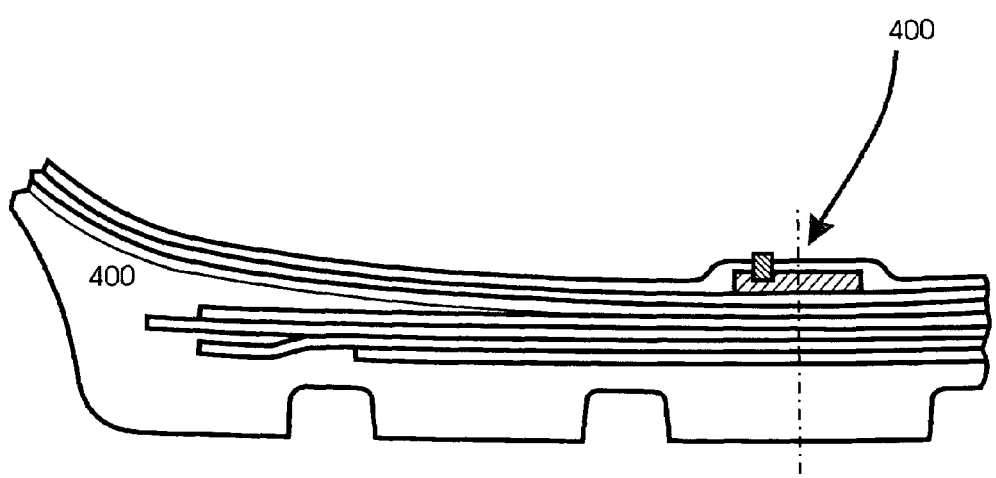
FIG. 21A is a cutaway view of the PVDF sensor of FIG. 21.

Although piezoelectric SAW devices normally use rigid material such as quartz or lithium niobate, it is also possible to utilize polyvinylidene fluoride (PVDF) providing the frequency is low. A piece of PVDF film can also be used as a sensor of tire flexure by itself. Such a sensor is illustrated in FIGS. 21 and 21A at 400. The output of flexure of the PVDF film can be used to supply power to a silicon microcircuit that contains pressure and temperature sensors. The waveform of the output from the PVDF film also provides information as to the flexure of an automobile tire and can be used to diagnose problems with the tire as well as the tire footprint in a manner similar to the device described in FIG. 3. In this case, however, the PVDF film supplies sufficient power to permit significantly more transmission energy to be provided. The frequency and informational content can be made compatible with the SAW interrogator described above such that the same interrogator can be used. The power available for the interrogator, however, can be significantly greater thus increasing the reliability and reading range of the system.

There is a general problem with tire pressure monitors as well as systems that attempt to interrogate passive SAW or electronic RFID type devices in that the FCC severely limits the frequencies and radiating power that can be used. Once it becomes evident that these systems will eventually save many lives, the FCC can be expected to modify their position. In the meantime, various schemes can be used to help alleviate this problem. The lower frequencies that have been opened for automotive radar permit higher power to be used and they could be candidates for the devices discussed above. It is also possible, in some cases, to transmit power on multiple frequencies and combine the received power to boost the available energy. Energy can of course be stored and periodically used to drive circuits and work is ongoing to reduce the voltage required to operate semiconductors. The devices of this invention will make use of some or all of these developments as they take place.

If the vehicle has been at rest for a significant time period, power will leak from the storage capacitors and will not be available for transmission. However, a few tire rotations are sufficient to provide the necessary energy.

Figure 22:
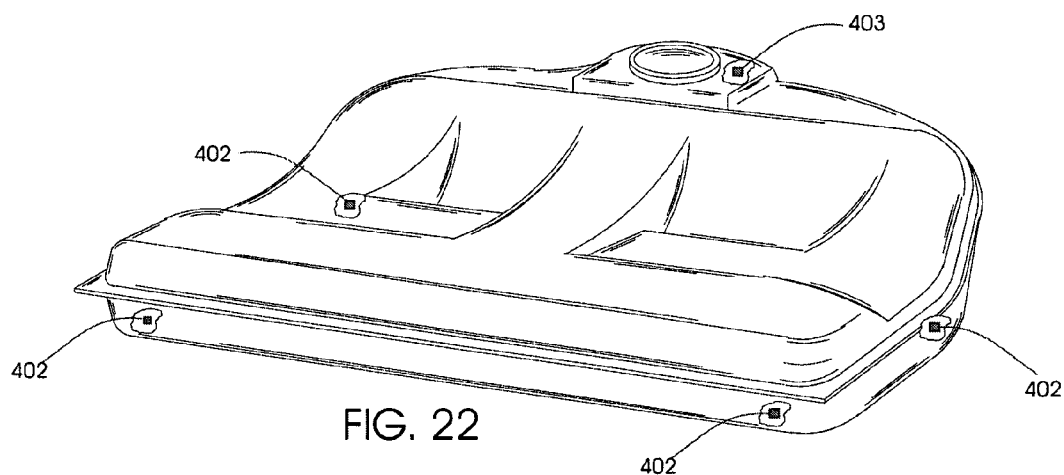
FIG. 22 is a perspective view with portions cutaway of a SAW based vehicle gas gage.
Figure 22A:
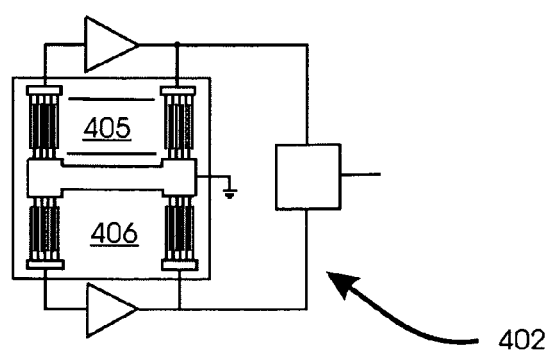
FIG. 22A is a top detailed view of a SAW pressure and temperature monitor for use in the system of FIG. 22.

U.S. patent application Ser. No. 08/819,609, now U.S. Pat. No. 6,615,656, provides multiple means for determining the amount of gas in a gas tank. Using the SAW pressure devices of this invention, multiple pressure sensors can be placed at appropriate locations within a fuel tank to measure the fluid pressure and thereby determine the quantity of fuel remaining in the tank. This is illustrated in FIG. 22. In this example, four SAW pressure transducers 402 are placed on the bottom of the fuel tank and one SAW pressure transducer 403 is placed at the top of the fuel tank to eliminate the effects of vapor pressure within tank. Using neural networks, or other pattern recognition techniques, the quantity of fuel in the tank can be accurately determined from these pressure readings in a manner similar that described the '609 patent application. The SAW measuring device illustrated in FIG. 22A combines temperature and pressure measurements in a single unit using parallel paths 405 and 406 in the same manner as described above.

Occupant weight sensors can give erroneous results if the seatbelt is pulled tight pushing the occupant into the seat. This is particularly a problem when the seatbelt is not attached to the seat. For such cases, it has been proposed to measure the tension in various parts of the seatbelt. Using conventional technology requires that such devices be hard-wired into the vehicle complicating the wire harness.

Figure 23:
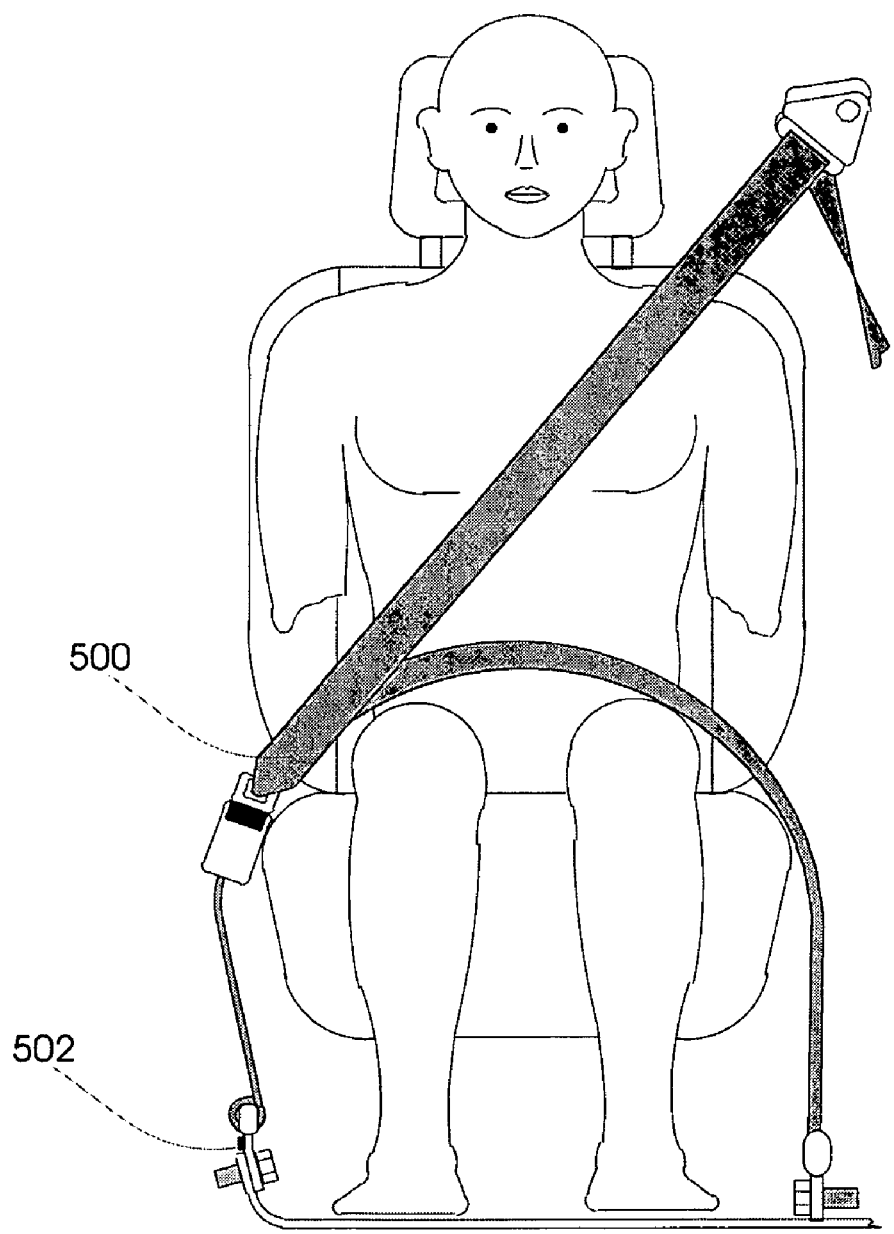
FIG. 23 is a partial cutaway view of a vehicle driver wearing a seatbelt with SAW force sensors.

With reference to FIG. 23, using a SAW strain gage as described above, the tension in the seat belt 500 can be measured without the requirement of power or signal wires. FIG. 23 illustrates a powerless and wireless passive SAW strain gage based device 502 for this purpose. There are many other places that such a device can be mounted to measure the tension in the seatbelt at one or at multiple places.

Figure 24:
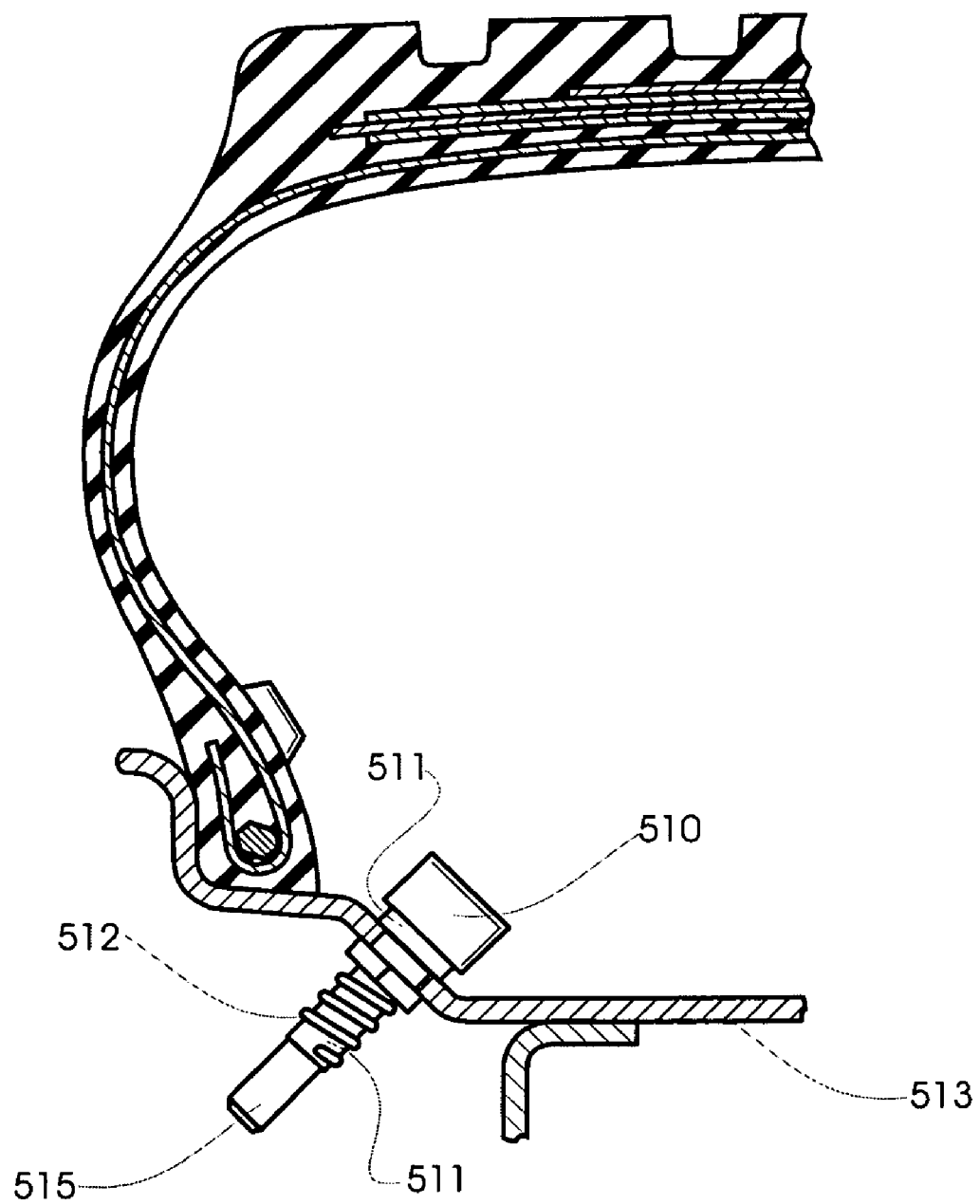
FIG. 24 is an alternate arrangement of a SAW tire pressure and temperature monitor installed in the wheel rim facing inside.

FIG. 24 illustrates another version of a tire temperature and/or pressure monitor 510. Monitor 510 may include at an inward end, any one of the temperature transducers or sensors described above and/or any one of the pressure transducers or sensors described above, or any one of the combination temperature and pressure transducers or sensors described above.

The monitor 510 has an elongate body attached through the wheel rim 513 typically on the inside of the tire so that the under-vehicle mounted antenna(s) have a line of sight view of antenna 515. Monitor 510 is connected to an inductive wire 512, which matches the output of the device with the antenna 515, which is part of the device assembly. Insulating material 511 surrounds the body which provides an air tight seal and prevents electrical contact with the wheel rim 513.

Figure 25A:
FIG. 25A is a schematic of a prior art deployment scheme for an airbag module.

FIG. 25A shows a schematic of a prior art airbag module deployment scheme in which sensors, which detect data for use in determining whether to deploy an airbag in the airbag module, are wired to an electronic control unit (ECU) and a command to initiate deployment of the airbag in the airbag module is sent wirelessly.

Figure 25B:
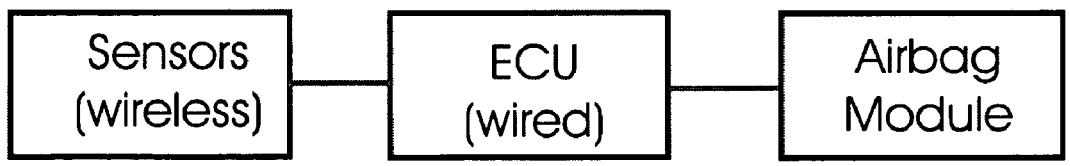
FIG. 25B is a schematic of a deployment scheme for an airbag module in accordance with the invention.

By contrast, as shown in FIG. 25B, in accordance with the invention, the sensors are wireless connected to the electronic control unit and thus transmit data wirelessly. The ECU is however wired to the airbag module.

SAW sensors also have applicability to various other sectors of the vehicle, including the powertrain, chassis, and occupant comfort and convenience. For example, SAW sensors have applicability to sensors for the powertrain area including oxygen sensors, gear-tooth Hall effect sensors, variable reluctance sensors, digital speed and position sensors, oil condition sensors, rotary position sensors, low pressure sensors, manifold absolute pressure/manifold air temperature (MAP/MAT) sensors, medium pressure sensors, turbo pressure sensors, knock sensors, coolant/fluid temperature sensors, and transmission temperature sensors.

SAW sensors for chassis applications include gear-tooth Hall effect sensors, variable reluctance sensors, digital speed and position sensors, rotary position sensors, non-contact steering position sensors, and digital ABS (anti-lock braking system) sensors.

SAW sensors for the occupant comfort and convenience area include low tire pressure sensors, HVAC temperature and humidity sensors, air temperature sensors, and oil condition sensors.

SAW sensors also have applicability such areas as controlling evaporative emissions, transmission shifting, mass air flow meters, oxygen, NOx and hydrocarbon sensors. SAW based sensors are particularly useful in high temperature environments where many other technologies fail.

SAW sensors can facilitate compliance with U.S. regulations concerning evaporative system monitoring in vehicles, through a SAW fuel vapor pressure and temperature sensors that measure fuel vapor pressure within the fuel tank as well as temperature. If vapors leak into the atmosphere, the pressure within the tank drops. The sensor notifies the system of a fuel vapor leak, resulting in a warning signal to the driver and/or notification to a repair facility. This application is particularly important since the condition within the furl tank can be ascertained wirelessly reducing the chance of a fuel fire in an accident. The same interrogator that monitors the tire pressure SAW sensors can also monitor the fuel vapor pressure and temperature sensors resulting in significant economies.

A SAW humidity sensor can be used for measuring the relative humidity and the resulting information can be input to the engine management system or the heating, ventilation, and air conditioning (HVAC) system for more efficient operation. The relative humidity of the air entering an automotive engine impacts the engine's combustion efficiency; i.e., the ability of the spark plugs to ignite the fuel/air mixture in the combustion chamber at the proper time. A SAW humidity sensor in this case can measure the humidity level of the incoming engine air, helping to calculate a more precise fuel/air ratio for improved fuel economy and reduced emissions.

Dew point conditions are reached when the air is fully saturated with water. When the cabin dew point temperature matches the windshield glass temperature, water from the air condenses quickly, creating frost or fog. A SAW humidity sensor with a temperature-sensing element and a window glass-temperature-sensing element can prevent the formation of visible fog formation by automatically controlling the HVAC system.

Thus, disclosed above is a tire with an integral monitoring system, two spaced beads comprising steel wire, a tread, sidewalls, an innerliner and plies. The monitoring system comprises a tire monitor fixed opposite the tread and including a plurality of SAW sensors, a first SAW sensor measuring tangential and/or radial acceleration. Another SAW sensor is arranged to measure pressure of the tire while another can be arranged to measure temperature of the tire.

Another integral monitoring system comprises an elongate body extending through the wheel rim from an inward side of the wheel rim to an outward side of the wheel rim, a transducer arranged on one end of the body and arranged to provide a measurement of at least one of the temperature and pressure in a tire when a tire is mounted on the wheel rim, an antenna arranged on another end of the body, and an inductive wire coupling the transducer to the antenna to enable transmission of a signal related to the measurement provided by the transducer. Insulating material is optionally arranged over the body to prevent contact between the body and the wheel rim.

One embodiment of a SAW sensor in accordance with the invention comprises a substrate made of a material on which a wave is capable of traveling, an interdigital transducer arranged in connection with the substrate, an antenna coupled to the interdigital transducer, at least one reflector spaced from the interdigital transducer, and at least one coating of a material sensitive to pressure arranged on the substrate between the interdigital transducer and the reflector such that the sensor provides a measurement of pressure. The coating may be an oxygen or nitrogen absorbent or reactive material, or made of at least one polymer.

When multiple reflectors are provided, one coating is arranged immediately between the interdigital transducer and a proximate one of the reflectors and additional coating are arranged between adjacent reflectors.

When two reflectors are provided, the substrate can be made of a material which changes as a function of temperature. In this case, the interdigital transducer may be arranged between the reflectors such that the sensor provides a measurement of both pressure and temperature. A flexible membrane may be arranged over the sensor.

Another embodiment of a SAW sensor in accordance with the invention comprises a substrate made of a material on which a wave is capable of traveling and which changes as a function of temperature, a first interdigital transducer arranged on the substrate, an antenna coupled to the first interdigital transducer, and a thermister arranged on the substrate spaced from the first interdigital transducer such that the sensor provides a measurement of temperature.

Yet another embodiment of a SAW sensor in accordance with the invention comprises a substrate made of a material on which a wave is capable of traveling, first and second interdigital transducers arranged on the substrate, at least one antenna coupled to the first and second interdigital transducers, and first and second reflectors spaced from the at least one interdigital transducer such that two properties of the substrate are measured. A coating of a material sensitive to pressure is optionally arranged on the substrate between the first interdigital transducer and the first reflector. The coating can comprise at least one oxygen or nitrogen sensing material. If two antennas are provided, each may be coupled to a respective one of the first and second interdigital transducers. Optionally, a material is arranged on the substrate which is sensitive to the presence or concentration of a gas, vapor, or liquid chemical. Also, a coating of a material sensitive to carbon dioxide may be arranged on the substrate between the first interdigital transducer and the first reflector.

Still another embodiment of a SAW sensor in accordance with the invention comprises a substrate made of a material on which a wave is capable of traveling, an interdigital transducer arranged in connection with the substrate, an antenna coupled to the interdigital transducer, at least one reflector spaced from the interdigital transducer, and at least one coating of a material sensitive to carbon dioxide arranged on the substrate between the interdigital transducer and the reflector such that the sensor provides a measurement of the presence of carbon dioxide. Such a SAW sensor is optimally arranged in an interior of a vehicle trunk. In this case, an automatic trunk opening device is coupled to the sensor such that upon the sensor detecting carbon dioxide in the interior of the trunk indicative of the presence of a life form, the automatic trunk opening device opens the trunk. An interrogator may be provided to interrogate the sensor and be coupled to the automatic trunk opening device.

One embodiment of a switch for a vehicle in accordance with the invention comprises a SAW sensor having a substrate, an interdigital transducer arranged on the substrate and a reflector arranged on the substrate spaced from the interdigital transducer; and a material sheet including a projection in engagement with the substrate in a space between the interdigital transducer and the reflector such that pressure on the substrate is transferred by the projection to the substrate.

Another embodiment of a switch comprises a SAW sensor having a substrate, an interdigital transducer arranged on the substrate, a reflector arranged on the substrate spaced from the interdigital transducer and a projection arranged on the substrate between the interdigital transducer and the reflector, and a material sheet arranged in engagement with the projection such that pressure on the substrate is transferred by the projection to the substrate.

An embodiment of an accelerometer in accordance with the invention comprises a SAW sensor having a substrate, an interdigital transducer arranged on the substrate, a reflector arranged on the substrate spaced from the interdigital transducer, an interface material adjacent to the substrate between the interdigital transducer and the reflector, and an acceleration-sensing mass arranged on the interface material whereby acceleration of the mass changes pressure on the substrate and thereby dampens or changes the speed on a surface wave on the substrate. The interface material may be a silicone rubber foam.

In one embodiment of a method for operating an interrogator for interrogating at least one SAW sensor, the following steps are performed: generating and transmitting two frequencies, F1 and F1+F2, from the interrogator during a burst time; continuing transmission of frequency F1 after the burst time until a frequency F2 is received from the at least one SAW sensor; receiving the two frequencies at the at least one SAW sensor; and mixing the two frequencies to yield a frequency F2 which is modulated by the at least one SAW sensor and contains the information about the measurement being performed by the at least one SAW sensor. The two frequencies may be generated using an oscillator and a mixer.

An embodiment of a tire monitoring system in accordance with the invention comprises an antenna package comprising a microstrip or stripline antenna array and a SAW sensor associated with each tire and including an antenna adapted to receive data from and transmit data to the antenna array. The antennas of the antenna array which face each tire may be in an X configuration such that the transmissions to and from the tires can be accomplished regardless of tire rotation angle.

In one embodiment of a method for monitoring tire temperature and pressure, the following steps are performed: mounting sensors in positions to obtain a reading of the temperature and/or pressure of tires, the sensors being sensitized to react to a transmission at a particular frequency, mounting an interrogator on the vehicle adapted to receive communications from the sensors, periodically sending a signal at the frequency to which the sensors are sensitized causing the sensors to respond and transmit a signal containing the temperature and/or pressure of the associated tire, and processing the signals from the sensors to obtain an indication of the temperature and/or pressure of the tires. Further, the temperature and/or pressure of the tires can be analyzed to determine if the tires are deflated, experiencing or about to experience tread separation or are overheating. The driver may be notified or indicia to the driver displayed, of the condition of the tires. At least one of the sensors may be mounted to a valve stem of a tire. The interrogator may be provided with several antennas spaced apart from one another such that a comparison of the signal from the sensors enables the location of each sensor to be approximately determined. The sensors can use surface acoustic wave technology wherein a radio frequency wave is converted into an acoustic wave which then travels on the surface of a material whereby the acoustic wave is modified based on a state being measured by the sensor and the modified wave is sensed by one or more interdigital transducers and converted back to a radio frequency wave which is used to excite an antenna for transmitting the wave to interrogator. The interrogator may be positioned relative to the sensors such that the distance between each sensor and the interrogator is different.

An embodiment of a system for controlling deployment of an occupant restraint device in accordance with the invention comprises acceleration sensors for measuring accelerations of the vehicle or a part thereof, each sensor including a receiving unit for receiving a radio frequency signal, first conversion means for converting the radio frequency signal into an acoustic wave, means for causing the acoustic wave to be modified based on the measured acceleration, second conversion means for converting the modified acoustic wave into a radio frequency signal, and a transmission unit for transmitting the radio frequency signal; and at least one interrogator structured and arranged to transmit and receive radio frequency signals such that the at least one interrogator receives the radio frequency signals transmitted by the acceleration sensors and processes the signals to determine whether the vehicle is experiencing a crash requiring deployment of the occupant restraint device. As to the arrangement of sensors, one or more may be arranged in a front or rear crush zone of the vehicle, in a door of the vehicle and/or in a passenger compartment of the vehicle. A sensor may comprise a substrate whereby the means for causing the acoustic wave to be modified based on the measured acceleration comprises bending of the substrate and an acceleration-sensing mass engages the substrate whereby acceleration of the mass changes a property of an acoustic wave on the substrate.

An embodiment of a system for controlling access to a vehicle in accordance with the invention comprises a portable card containing a SAW identification system including a receiving unit for receiving a radio frequency signal, first conversion means for converting the radio frequency signal into an acoustic wave, means for modifying the acoustic wave, second conversion means for converting the modified acoustic wave into a radio frequency signal, and a transmission unit for transmitting the radio frequency signal; and an interrogator arranged on the vehicle and structured and arranged to transmit and receive radio frequency signals such that the interrogator receives the radio frequency signal transmitted by the portable card and processes the signal to determine whether the signal is identical to a signal indicative of an authorized user of the vehicle. A processor may be coupled to the interrogator for controlling ignition of the vehicle and/or locks on the vehicles based on the determination of whether the signal is identical to a signal indicative of an authorized user of the vehicle, a distance between the portable card and the vehicle and/or the presence or absence of an occupant in the vehicle.

An embodiment of a tire monitoring device in accordance with one embodiment of the invention comprises sensor means for measuring pressure and temperature of the tire, an accelerometer for measuring acceleration of a tread of the tire adjacent the sensor means; and a processor coupled to the sensor means and the accelerometer for receiving the measured pressure, temperature and acceleration and determining whether the tire is at a non-optimal condition. The processor can also measure a length of time that a tread portion is in contact with the road surface such that a diameter of the tire footprint on the road is obtained. The diameter of the tire footprint is analyzed to determine whether the tire is at a non-optimal condition.

Another embodiment of a tire-monitoring device in accordance with the invention comprises means for monitoring the curvature of the tire as it rotates and means for correlating the curvature of the tire into an indication of an operational state of the tire. The monitoring means may comprise a sensor mounted inside the tire at its largest diameter for measuring, e.g., mechanical strain. The correlation means may comprise a processor for determining a ratio of a time in which the sensor indicates constant strain and a time in which the sensor indicates increased stretch. The sensor can measure acceleration in any one axis, in which case, the correlation means may comprise a processor for analyzing a time of zero acceleration in relation to a time of non-zero acceleration.

Many changes, modifications, variations and other uses and applications of the subject invention will now become apparent to those skilled in the art after considering this specification and the accompanying drawings which disclose preferred embodiments thereof. All such changes, modifications, variations and other uses and applications which do not depart from the spirit and scope of the invention are deemed to be covered by the invention which is limited only by the following claims.

The invention claimed is:

1. A license plate for a vehicle, comprising:
   a plate having an indicia on a front face relating to registration or use of the vehicle and arranged to be mounted on the vehicle such that a rear face of said plate faces a part of the vehicle; and
   a transponder entirely integrated in said plate such that said plate is a self-contained plate including said transponder, said transponder being arranged to receive a first signal from an interrogator and transmit a second signal to the interrogator in response to reception of the first signal, the second signal being based on information about the vehicle.

2. The license plate of claim 1, wherein said transponder is a SAW transponder.

3. The license plate of claim 1, wherein said transponder is an RFID transponder.

4. The license plate of claim 1, wherein said transponder includes a reflective or back scattering antenna, a polarization antenna, a rotating antenna, or a corner cube or dihedral reflector.

5. The license plate of claim 1, further comprising an energy harvesting component arranged on said plate for providing power to said transponder, said energy harvesting component being arranged to generate energy during or from movement or vibration of the vehicle.

6. A vehicle including the license plate of claim 1 and at least one additional transponder, each of said at least one additional transponder being arranged to receive a signal from the interrogator, modify the received signal and transmit the modified signal to the interrogator.

7. A vehicle including the license plate of claim 1, wherein said transponder is arranged to process the first signal to form the second signal such that the second signal is indicative of an identification of said transponder.

8. A vehicle including the license plate of claim 1, wherein said transponder is arranged to process the first signal to form the second signal such that the second signal is indicative of an identification of said transponder and at least one of weight, size, type and travel privileges of the vehicle.

9. The vehicle of claim 8, wherein the transmitted information relates to the type of vehicle and the type of vehicle is an indication of whether the vehicle has special travel privileges.

10. A license plate for a vehicle, comprising:
    a plate having an indicia on a front face relating to registration or use of the vehicle and arranged to be mounted on the vehicle such that a rear face of said plate faces a part of the vehicle; and
    an RFID tag arranged as an integral part of said plate between said front and rear faces of said plate, said RFID tag being arranged to respond to an activation signal and transmit information relating to at least one of the type, size and mass of the vehicle to which said plate is mounted.

11. The license plate of claim 10, wherein the transmitted information relates to the type of vehicle and the type of vehicle is an indication of whether the vehicle has special travel privileges.

12. The license plate of claim 10, further comprising an energy harvesting component arranged on said plate for providing power to said RFID tag, said energy harvesting component being arranged to generate energy during or from movement or vibration of the vehicle.

13. A vehicle including the license plate of claim 10.

14. The license plate of claim 10, wherein said RFID tag is integrated in said plate.

15. A self-contained license plate for a vehicle capable of communicating information to a site apart from the vehicle, consisting of:
    a plate having an indicia on a front face and arranged to be mounted on the vehicle such that a rear face of said plate faces a part of the vehicle; and
    a transponder integrated in said plate between said front and rear face, said transponder being arranged to receive a first signal from an interrogator at the site apart from the vehicle and transmit a second signal to the interrogator in response to reception of the first signal.

16. The license plate of claim 15, wherein said transponder is a SAW transponder.

17. The license plate of claim 15, wherein said transponder is an RFID transponder.

18. The license plate of claim 15, further consisting of an energy harvesting component arranged on said plate for providing power to said transponder, said energy harvesting component being arranged to generate energy during or from movement or vibration of the vehicle.

19. A vehicle including the license plate of claim 15, wherein said transponder is arranged to process the first signal to form the second signal such that the second signal is indicative of an identification of said transponder.

20. A vehicle including the license plate of claim 15, wherein said transponder is arranged to process the first signal to form the second signal such that the second signal is indicative of an identification of said transponder and at least one of weight, size, type and travel privileges of the vehicle.

* * * * *